United States Patent
Johnson et al.

(10) Patent No.: US 6,313,584 B1
(45) Date of Patent: Nov. 6, 2001

(54) ELECTRICAL IMPEDANCE MATCHING SYSTEM AND METHOD

(75) Inventors: Wayne L. Johnson; Richard Parsons, both of Phoenix, AZ (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/508,103

(22) PCT Filed: Sep. 17, 1998

(86) PCT No.: PCT/US98/18497

§ 371 Date: Apr. 24, 2000

§ 102(e) Date: Apr. 24, 2000

(87) PCT Pub. No.: WO99/14855

PCT Pub. Date: Mar. 25, 1999

(51) Int. Cl.[7] .................................................. H01J 7/24
(52) U.S. Cl. .................................... 315/111.21; 333/17.3; 361/277; 427/569
(58) Field of Search .................... 315/111.21, 111.51, 315/111.71; 334/20, 78, 81, 84; 361/277; 333/17.3; 427/569, 570

(56) References Cited

U.S. PATENT DOCUMENTS

| | | | |
|---|---|---|---|
| 4,621,242 | 11/1986 | Theall, Jr. et al. | 364/17 M |
| 5,175,472 | * 12/1992 | Johnson, Jr. et al. | 315/111.21 |
| 5,195,045 | 3/1993 | Keane et al. | 364/482 |
| 5,288,971 | * 2/1994 | Knopp | 315/111.21 |
| 5,590,015 | 12/1996 | Planta et al. | 361/277 |
| 5,654,679 | 8/1997 | Mavretic et al. | 333/17.3 |
| 5,689,215 | * 11/1997 | Richardson et al. | 333/17.3 |
| 5,793,162 | 8/1998 | Barnes et al. | 315/111.21 |
| 5,866,985 | * 2/1999 | Coultas et al. | 315/111.21 |
| 5,892,198 | * 4/1999 | Barnes et al. | 219/121.54 |
| 5,971,591 | * 10/1999 | Vona et al. | 364/478.08 |
| 6,060,837 | * 5/2000 | Richardson et al. | 315/111.51 |
| 6,136,388 | * 10/2000 | Raoux et al. | 427/569 |

\* cited by examiner

*Primary Examiner*—Haissa Philogene
*Assistant Examiner*—Thuy Vinh Tran
(74) *Attorney, Agent, or Firm*—Oblon, Spivak, McClelland, Maier & Neustadt, P.C.

(57) ABSTRACT

A system and method for processing substrates having an improved matching system. A matching controller (1) is utilized to control multiple matching networks (MNA, MNB, MNC), thus providing improved, more rapid and stable matching. The matching controller can also automatically set up initial matching conditions required during and immediately after plasma initiation, to thereby provide faster and more reliable initial matching, and reduced operator involvement. The system also provides improved instrumentation, for more accurate phase and amplitude detection, and an improved arrangement of power detectors (6A, 6B, 6C). The matching network (MNA, MNB, MNC) also incorporates a circuit for reliable control of tunable elements in a matching network, and a device for protecting tunable elements against damage are also provided.

53 Claims, 16 Drawing Sheets

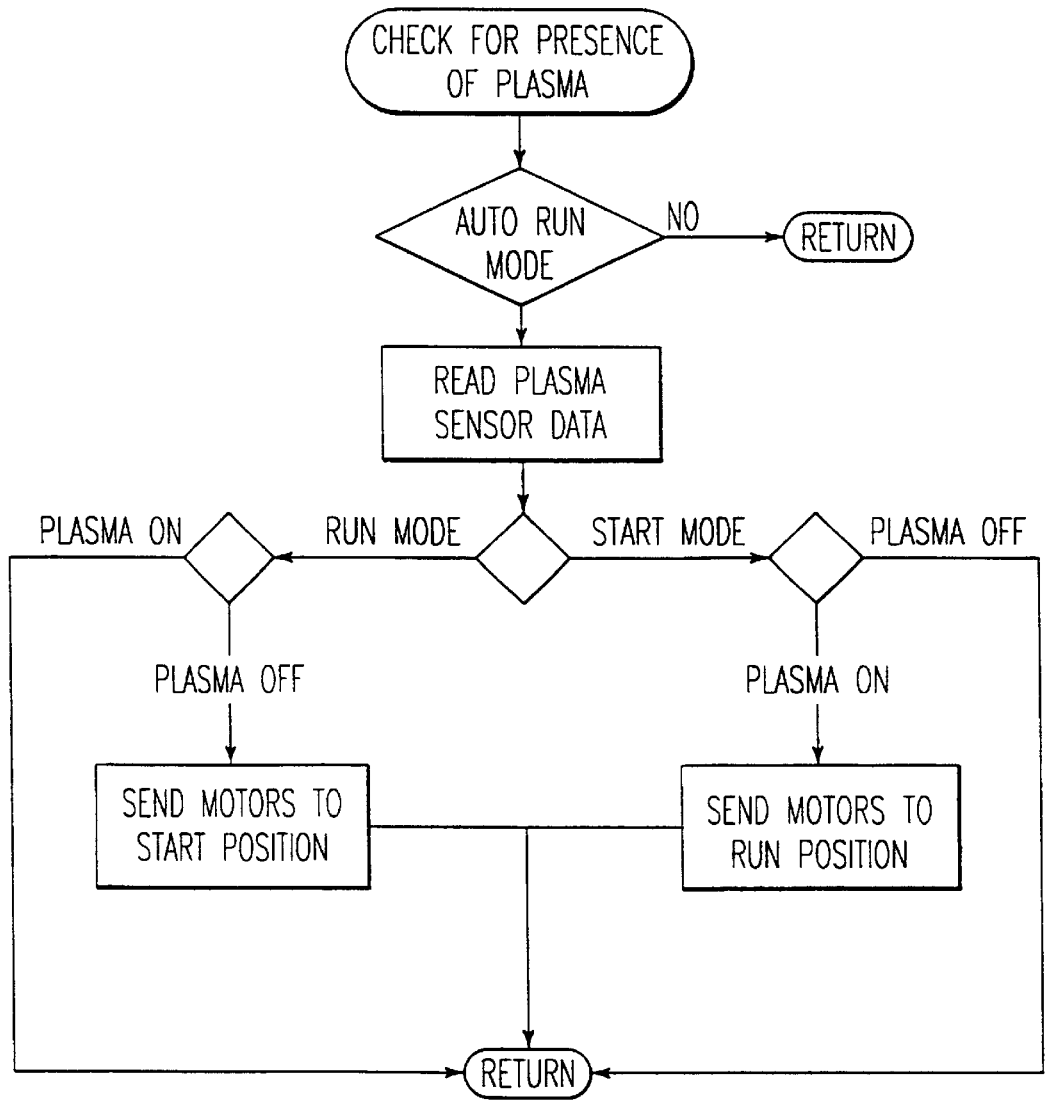

ELECTRICAL IMPEDANCE MATCHING SYSTEM AND METHOD

CROSS-REFERENCE TO OTHER CO-PENDING APPLICATIONS

This non-provisional application claims priority under 35 USC 119(e) to Ser. No. 60/059,176, filed Sep. 17, 1997, the contents of which are incorporated herein by reference. This application is related to "System and Method for Monitoring and Controlling Gas Plasma Processes," Ser. No. 60/059, 151, filed Sep. 17, 1997, and "DEVICE AND METHOD FOR DETECTING AND PREVENTING ARCING IN RF PLASMA SYSTEMS," Ser. No. 60/059,173, filed Sep. 17, 1997. Both of those provisional applications are incorporated by reference. This application is also related to "System and Method for Monitoring and Controlling Gas Plasma Processes," Ser. No. PCT/US98/18498, filed on even date herewith, and "DEVICE AND METHOD FOR DETECTING AND PREVENTING ARCING IN RF PLASMA SYSTEMS," Serial No. PCT/US98/18496, filed on even date herewith. Both of those non-provisional applications are incorporated by reference.

BACKGROUND OF THE INVENTION

1. Field of the Invention

The invention relates to electrical impedance matching systems, and particularly to systems which use electrical power to generate a plasma.

2. Discussion of the Background

In many electrical device and solid state manufacturing processes, a plasma is utilized to react, or to facilitate a reaction, with a substrate such as a semiconductor wafer. To generate a plasma, RF power can be supplied to a gas by a capacitive and/or an inductive plasma coupling element. For example, an electrode can be provided as capacitive coupling element, while a conductive loop or coil can be provided as an inductive (i.e., magnetic) coupling element.

If the impedances of the power source and the load (i.e., the element coupled to the plasma) are not matched, the power supplied to (or absorbed by) the load is not maximized, and it can -be difficult to control the amount of power absorbed by the load. In addition, unmatched impedances can be detrimental to the power source or to the components which are coupled to the power source. In most cases the load impedance (i.e., the input impedance of the plasma coupling element) cannot be determined in advance, since it is dependent on the state or condition of the plasma to which it is coupled, and the plasma state can vary during processing. Accordingly, many plasma processing systems utilize a matching network provided between the RF source and the plasma coupling element to match the impedances. The matching network is utilized in order to maximize the amount of RF power supplied to the plasma, and to control the amplitude and phase of this power.

Over the past thirty plus years, automatic impedance matching networks have been designed and implemented to maximize the transfer of power between a source power supply and load. Those networks are commonly found in the application of RF power to plasma generation in semiconductor processing (see Beaudry, U.S. Pat. No. 3,569,777; Seward, U.S. Pat. No. 4,112,395; Meacham & Haruff U.S. Pat. No. 4,557,819; Collins et al., U.S. Pat. No. 5,187,454; Shel, U.S. Pat. No. 5,585,766; Smith et al., U.S. Pat. No. 5,621,331; Richardson et al., U.S. Pat. No. 5,689,215; Barnes & Holland, World Patent WO9724748). They are also found in the application of VHF/UHF power to plasma generation in semiconductor processing (see Collins & Roderick, U.S. Pat. No. 5,065,118), and the application of microwaves to plasma generation in semiconductor processing (see Kingma & Vaneldik, U.S. Pat. No. 3,617,953; Rogers, U.S. Pat. Nos. 3,745,488, 5,041,803; Ishida & Taniguchi, U.S. Pat. No. 5,079,507; U.S. Pat. No. 5,543, 689), and RF antenna broadcast (see Kuecken, U.S. Pat. 3,601,717; Templin, U.S. Pat. No. 3,794,941; Smolka, U.S. Pat. Nos. 3,825,825; 3,919,644; Straw, U.S. Pat. No. 3,959, 746; Brunner, U.S. Pat. No. 3,995,237; Ott, U.S. Pat. No. 4,004,102; Armitage, U.S. Pat. No. 4,356,458,; Theall, U.S. Pat. No. 4,375,051; Collins, U.S. Pat. No. 4,951,009; Gubisch, U.S. Pat. No. 5,057,783; Roberts & DeWitt, U.S. Pat. No. 5,225,847; Flaxi, U.S. Pat. No. 5,491,715).

One of the first patents to address the automation of impedance matching in plasma processing is Beaudry (U.S. Pat. No. 3,569,777). It uses mechanically adjusting variable capacitors and inductors. Stimson (U.S. Pat. No. 5,629,653, Applied Materials, Inc.) and Mazza (Automatic Impedance Matching system for RF sputtering, IBM J. Res. Devel. p 192, 1970) also use two capacitors to tune the impedance mismatch.

In general, the measurement of power transmitted to the load has been completed from a measurement of the voltage, current and phase. Conventionally, the feedback control algorithm iteratively adjusts the capacitances until either the transferred power is maximized or the reflected power is minimized and has been applied to matching networks employed in the coupling of RF power to plasma devices for semiconductor processing. Methods of detecting the impedance mismatch between the source and the load are (a) to monitor the voltage standing wave ratio (see Templin, U.S. Pat. No. 3,794,941; and Brounley, U.S. Pat. No. 5,473,291), and (b) to monitor the impedance of the plasma reactor (see Bouyer et al., U.S. Pat. No. 4,990,859), An example of a known matching network is illustrated in FIG. 9, in which a matching network MN matches the impedance of a power source 2 with that of a load 3. The matching network, which is connected between a cable 70 and the load 3, includes a constant inductor L and variable capacitors C1 and C2. The matching network is tuned using servomotors 80A and 80B to vary the capacitance of the variable capacitors. Alternatively, the impedance of a variable inductor can also be controlled. The servomotors 80A, 80B are driven by a matching controller (not shown), which also monitors the quality of matching using electrical connections within the matching network. By accurately controlling the plasma-generating power, the plasma conditions are more controllable and reproducible, thereby improving the yield and accuracy of the process, and preventing damage to the power source or other components of the system.

Several patents have been issued that address some aspects of intelligent control of impedance matching. In fact, most patents proposing automatic impedance matching require some form of an "intelligent" controller (such as those referenced above). In general, the intelligent systems attempt to obtain some correlation between settings for variable reactances (i.e., capacitors and inductors) and plasma conditions such as the load impedance or plasma chamber input parameters (i.e., RF input power, chamber pressure, etc.). Through obtaining such a correlation, fast, stable coarse tuning of the impedance matching can be obtained. For example, Keane & Hauer (U.S. Pat. No. 5,195,045) present a method of using predetermined set points for two impedance varying devices in order to solve tuning problems during run conditions. Additionally, Ohta & Sekizawa (U.S. Patent No. 5,543,689) have proposed storing match circuit settings from prior use; in some sense, characterizing their system a priori. Others attempt to use an estimated load impedance and a measured input impedance to the network wherein coupling the information forms a predictive-corrective algorithm for a tuning control function (Collins et al., U.S. Pat. No. 5,187,454). Smith et al.(U.S. Pat. No. 5,621,331) have presented a notable method for rapidly adjusting the impedance of a variable impedance device to match the impedance of a source to the impedance of a load in a plasma processing device. The device includes a plurality of electrical sensors, photo-sensitive detector, a data processor and a memory. In particular, measurements of chemical species present within the plasma using an optical emission spectrometer and electrical measurements taken on plasma coupling elements have been correlated with variable reactance settings.

Neural networks have been used for both predication and control in many areas. A use of neural networks in semiconductor processing to predict the endpoint of an etch process is discussed by Maynard et al. in "Plasma etching endpointing by monitoring RF power systems with an artificial neural network," Electrochem. Soc. Proc., 95–4, p 189–207, 1995, and "Plasma etching endpointing by monitoring radio-frequency power systems with an artificial neural network," J. Electrochem. Soc., 143 (6).

Conventional matching systems have a number of shortcomings. For example, as solid state device processing technology has advanced, the plasma processing systems have become more complex, requiring multiple plasma coupling elements. In conventional systems, the coupling elements have been supplied with RF power through separate matching networks controlled by independent matching controllers. However, with independent matching controllers, control of the matching conditions can become unstable, as one controller attempts to tune one matching network, while another controller attempts to tune another matching network. If multiple plasma coupling elements are all coupled to the same plasma, the controllers can interfere or compete with each other and, in severe cases, can cause uncontrolled oscillation of the servomotors controlling the variable capacitors. Even if uncontrolled oscillations do not result, the multiple matching controllers can be slow in reaching a matched condition, since tuning of one matching network will affect the matching of a coupling element associated with another matching network, requiring further matching/tuning until all of the matching networks have converged upon a matched condition. In fact, difficulties in simultaneously matching multiple plasma coupling elements have caused some manufacturers to avoid using variable matching networks altogether. Instead, these manufacturers use either no matching networks or non-tunable matching networks, and the frequencies of the RF sources are tuned in order to optimize the coupling to the plasma. One of the disadvantages with this approach is that it can be very expensive to purchase multiple, independently frequency-tunable RF sources. Therefore, there is a need for improved matching networks, and particularly for improved control of systems having plural matching networks Another problem with conventional systems is that they may require highly skilled operator personnel, especially when several different processes are used, each with a different set of operating conditions. Of particular importance are the skills required to initiate a plasma and to tune the matching networks to their initial conditions immediately after plasma initiation. In conventional systems, these steps require an experienced, highly trained operator (the operator makes manual adjustments until the system is approximately matched, and then the operator turns on the matching controller). However, skilled operators are often not readily available and, in order to reduce labor costs, manufacturers have a desire to employ less skilled operators. As a result, the matching controllers should be more intelligent, require less operator supervision, and be less susceptible to operator error.

There are also several important limitations of the instruments currently used to measure the matching of the RF source to the plasma coupling element(s). For example, conventional phase detectors have a poor dynamic range, due to low sensitivity at low voltage levels and due to overloads of the circuitry at high voltage levels. In addition, conventional peak detectors, used to determine the amplitude of voltages at the matching networks, have a poor dynamic range, due to voltage offset errors caused by diodes used in their circuitry. These offset errors can reduce the sensitivity of the peak detectors at low voltage levels.

Conventional systems also rely on forward/reflected power detection at the power source itself, and therefore can suffer from errors caused by poorly characterized, or even damaged, cables. Accordingly, another deficiency of conventional systems is the reliance upon forward/reflected power detection at the power source.

Several problems are also associated with the circuits currently used to control the motors that tune the capacitive elements in the matching networks. In addition to being overly complex and expensive, conventional control circuits offer insufficient protection against damage to the capacitors, which can be caused by mechanical components being forced to travel beyond their acceptable range of operation. Moreover, conventional servomotor arrangements and associated circuitry can be slow in starting and/or stopping movement when tuning the variable impedance elements.

Accordingly, improved plasma power control systems are needed which provide matched power and load impedances and which avoid the foregoing shortcomings. In addition, an improved control is needed for systems which include multiple matching networks.

SUMMARY OF THE INVENTION

The present invention provides a variety of features which achieve improved matching. Various aspects of the present invention can be utilized separately from other aspects, however, the various aspects can also be combined to overcome an array of shortcomings associated with conventional matching networks.

According to one aspect of the invention, the matching controllers of plural matching networks communicate with each other to decide how to tune the matching networks properly and how best to converge, in a stable fashion, on a matched condition. In one embodiment, all matching networks are controlled by a single master matching controller.

According to another aspect of the invention, a process controller controls the matching controllers and the RF power sources, according to a set of predetermined parameters, so that the plasma processing system can be controlled automatically, requiring little or no operator involvement. The predetermined parameters include the mathematical parameters used in feedback control loops of the matching controllers, and the amounts of RF power supplied to the plasma coupling elements. The appropriate values of the processing parameters, which are stored in a non-volatile memory, may be determined either manually or by an automated setup and testing sequence. The invention also provides a matching network in which the initial matching parameters are automatically set up so as to achieve matching conditions more quickly, without requiring a highly skilled operator.

According to another aspect of the invention, a four quadrant multiplier phase detector is used in order to provide the matching controller with accurate information regarding the matching conditions. This phase detector multiplies an incoming signal from the matching network with a signal from the RF power source by first taking the logarithm of each signal, then adding the two logarithms, and then taking the inverse logarithm of the result, thus yielding the product of the two original signals. This technique is more accurate, and provides a higher dynamic range (i.e., the ratio of the maximum and minimum allowable signal levels), than conventional multiplying techniques which use diode mixers. The arrangement and technique of the invention avoids noise problems at extremely low signal levels. In addition, the present invention avoids a common problem, often seen at high signal levels, of thermal drift of diode properties and, in extreme cases, diode damage or burnout. By extending the useful range of the phase detection for both small and large signals, the present invention provides a high dynamic range.

In accordance with a further aspect of the invention, highly accurate, high speed, active peak detectors are utilized to give an accurate indication of voltage and current at low power levels.

The invention also provides a forward (i.e., incident) and reflected power indicator located at the input to the matching network, as opposed to the conventional technique of providing this instrument only at the output of the RF source. This arrangement of the invention provides a more accurate reading/indication of the quality of matching, and is less susceptible to errors caused by inconsistencies and damage to the cables leading from the RF source to the matching network.

Another feature of the invention provides a rapidly responding circuit for controlling the servomotors that tune the variable impedance elements (e.g., capacitors) of a matching network. In addition, the variable impedance elements are provided with physical limit switches which limit the amount of mechanical travel of the members tuning the impedance elements, thus preventing damage to these expensive components. As a result, the variable impedance elements of the matching network are more reliable.

The features of the present invention provide a number of advantages in improving the performance of RF matching systems. For example, the invention makes possible a highly intelligent system for matching control, which includes improved instrumentation, as well as protection against damage of expensive components. In addition, the system of the invention can be operated by personnel with significantly less training than those required to operate conventional systems, and the system is less susceptible to human error. In fact, according to several preferred embodiments, the system may be operated unattended.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 12A–12G are flowcharts of an operation of a matching network process according to one embodiment of the present invention;

DETAILED DESCRIPTION OF THE PREFERRED EMBODIMENTS

Figure 1:
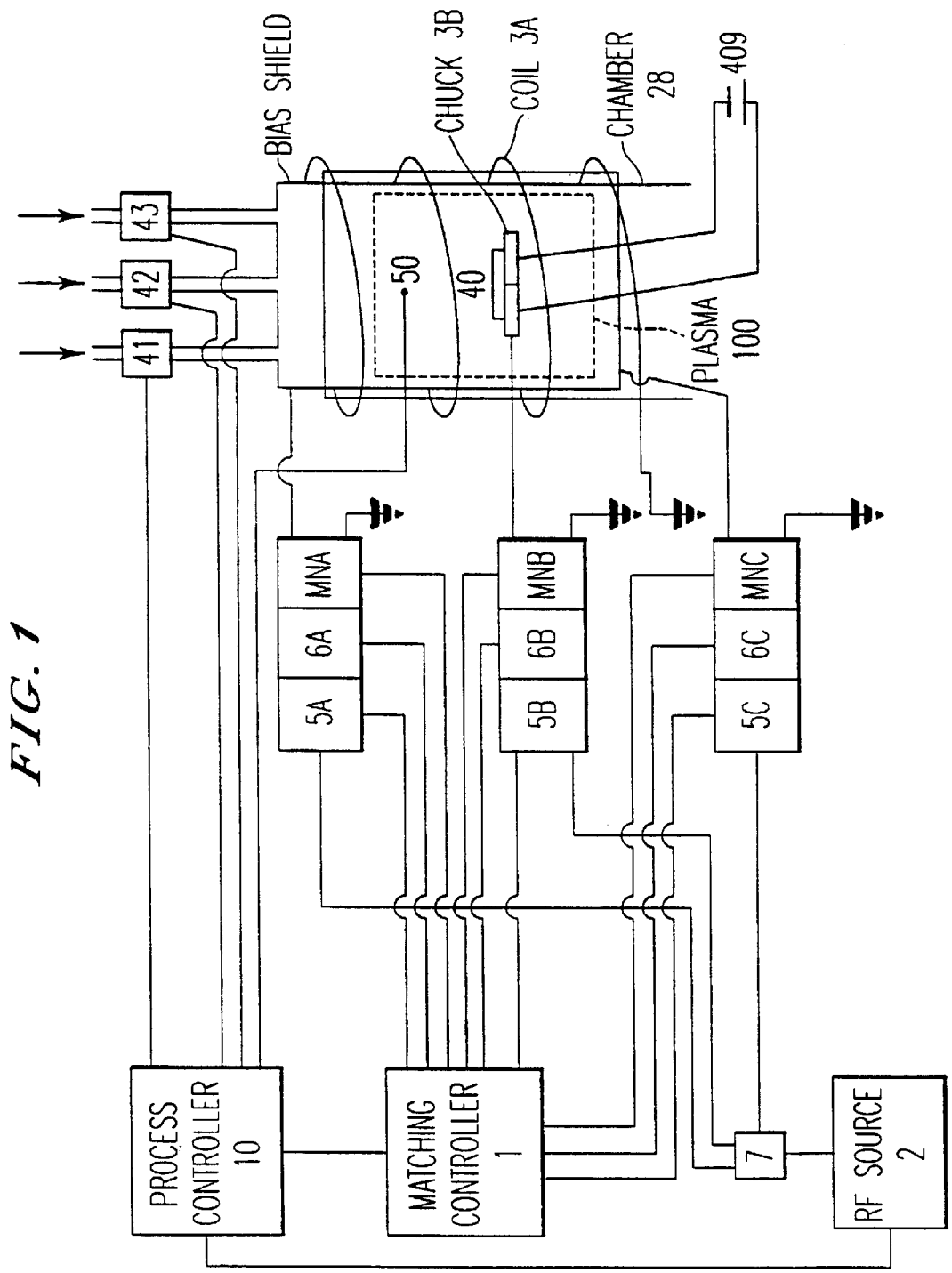
FIG. 1 is a schematic illustration of an RF plasma processing system to which the present invention is applicable.

Turning now to the drawings in which like reference numerals designate identical or corresponding parts throughout the several views, FIG. 1 schematically represents a plasma processing system to which the present invention is applicable. It is to be understood that the system of FIG. 1 is provided as an example, and various aspects of the present invention can also be advantageously utilized in other systems which utilize matching networks. For example, the invention can also be utilized in systems which do not utilize inductive plasma coupling elements (e.g., sputtering systems). The system of FIG. 1 includes a process chamber 28 and an RF source 2. The RF source 2 provides power to electrical components of the system, more particularly to plasma coupling elements in the form of a magnetic coil 3A, an electrostatic chuck 3B, and a bias shield 3C. The system further includes matching networks MNA, MNB and MNC, a matching controller 1, and a process controller 10. In this example, the workpiece, e.g., a wafer 40, is held by a plasma coupling element in the form of an electrostatic chuck 3B. Two portions of the chuck are biased by a DC voltage source 409, in order to hold the wafer in place.

In the system of FIG. 1, gases are introduced into the chamber using gas flow controllers 41, 42, and 43. RF power is sent from the RF source 2 to a splitter 7, then through cables to respective phase and amplitude detectors 5A, 5B, and 5C, and forward (i.e., incident) and reflected power detectors (i.e. indicators) 6A, 6B, and 6C. The power passes through the detectors to the respective matching networks, and then to the respective plasma coupling elements, which cause a plasma 100 to be initiated and maintained in the process chamber. It is to be understood that, although the system of FIG. 1 includes a single RF source which supplies power to all of the plasma coupling elements, the invention is also applicable to systems having more than one RF source (e.g., systems including a plurality of RF sources, each dedicated to one of a plurality of plasma coupling elements). It is to be further understood that while, in the system of FIG. 1, RF power passes through the phase and amplitude detectors and the forward and reflected power detectors, the invention is also applicable to systems in which the RF power is coupled to the detectors, but does not pass through the detectors.

Figure 2:
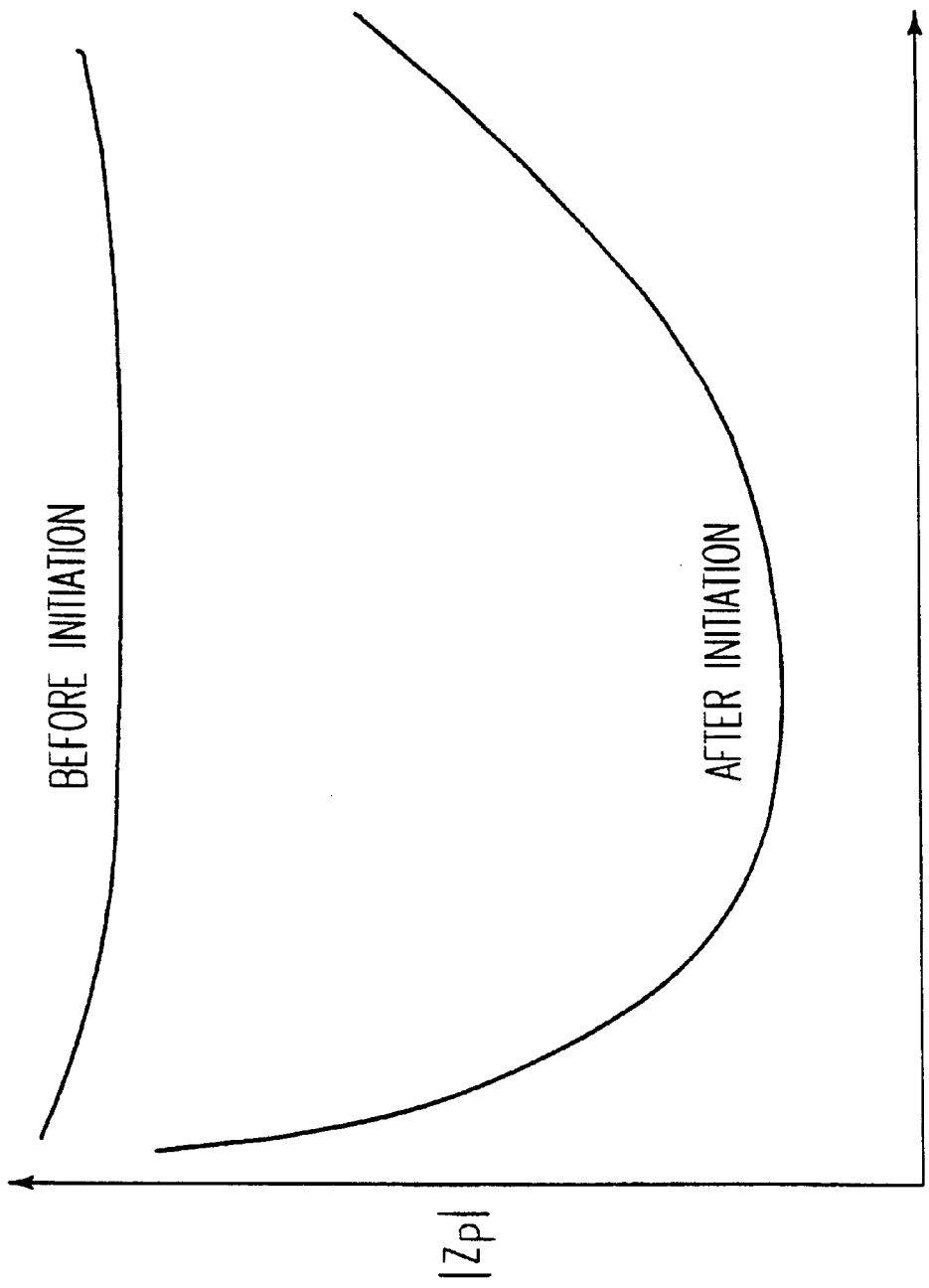
FIG. 2 is a graph plotting impedance vs. pressure for a plasma.

During plasma initiation, when the plasma is first started, the matching networks must be tuned so that high electric fields, necessary for plasma initiation, can be supplied to the gas. Once the plasma has been initiated, the input impedance of the plasma coupling elements (including effects from the plasma) changes. By way of illustration, FIG. 2 represents the impedance vs. pressure curves of a plasma coupling element, both before and after plasma initiation. As shown in FIG. 2, the impedance vs. pressure characteristics are significantly different before initiation than after initiation. The matching networks must respond to this change as quickly as possible, in order to maintain well-controlled plasma conditions.

In the arrangement of FIG. 1, multiple plasma coupling elements, such as the magnetic coil 3A, the wafer-holding chuck 3B, and the bias shield 3C are all coupled to the same plasma region. The result is that, when one of the matching networks is tuned or altered in any way (e.g., in responding to the initiation of the plasma), this tuning by one matching network has an effect on the matching conditions of one or more of the other plasma coupling elements and their respective matching networks. As discussed earlier, in conventional systems, the separate matching networks can compete with one another or oscillate in attempting to arrive at a desired matched condition. Thus, a stable matched condition is often difficult to achieve, particularly in an optimal amount of time.

According to an advantageous aspect of the invention, a single matching controller is used to control more than one matching network. In particular, in the embodiment of FIG. 3, a central master matching controller 1 is used to control all of the matching networks MNA, MNB, and MNC in the system. This matching controller receives information from the RF power source 2, phase and amplitude detectors 5A–5C, forward and reflected power indicators 6A–6C, and position sensors 201A–201C mounted on the servomotors utilized to tune the variable elements of the matching networks (see, e.g., servomotors 80A, 80B and variable capacitors C1, C2 of FIG. 9). In a presently preferred embodiment, the variable elements are capacitors.

Power is sent into a processing chamber 28 through plasma coupling elements 3A–3C, thereby initiating and maintaining a plasma (not shown in FIG. 3) in the chamber.

The matching controller 1 seeks to minimize the amount(s) of reflected power at the inputs of the matching networks using a feedback control loop technique. The feedback control loop technique utilizes phase, amplitude, and forward/reflected power information provided by the phase and amplitude detectors 5A–C and the forward and reflected power detectors 6A–6C at the inputs of the matching networks. Detectors 5A–5C, 6A–6C are used to determine the quality of matching of the plasma coupling elements 3A–3C to the RF source 2. By tuning the matching networks MNA–MNC, the quality of matching can be improved, thus minimizing the amount of reflected power. By minimizing the amount of reflected power, the matching controller maximizes the amount of power absorbed by the plasma.

Figure 3:
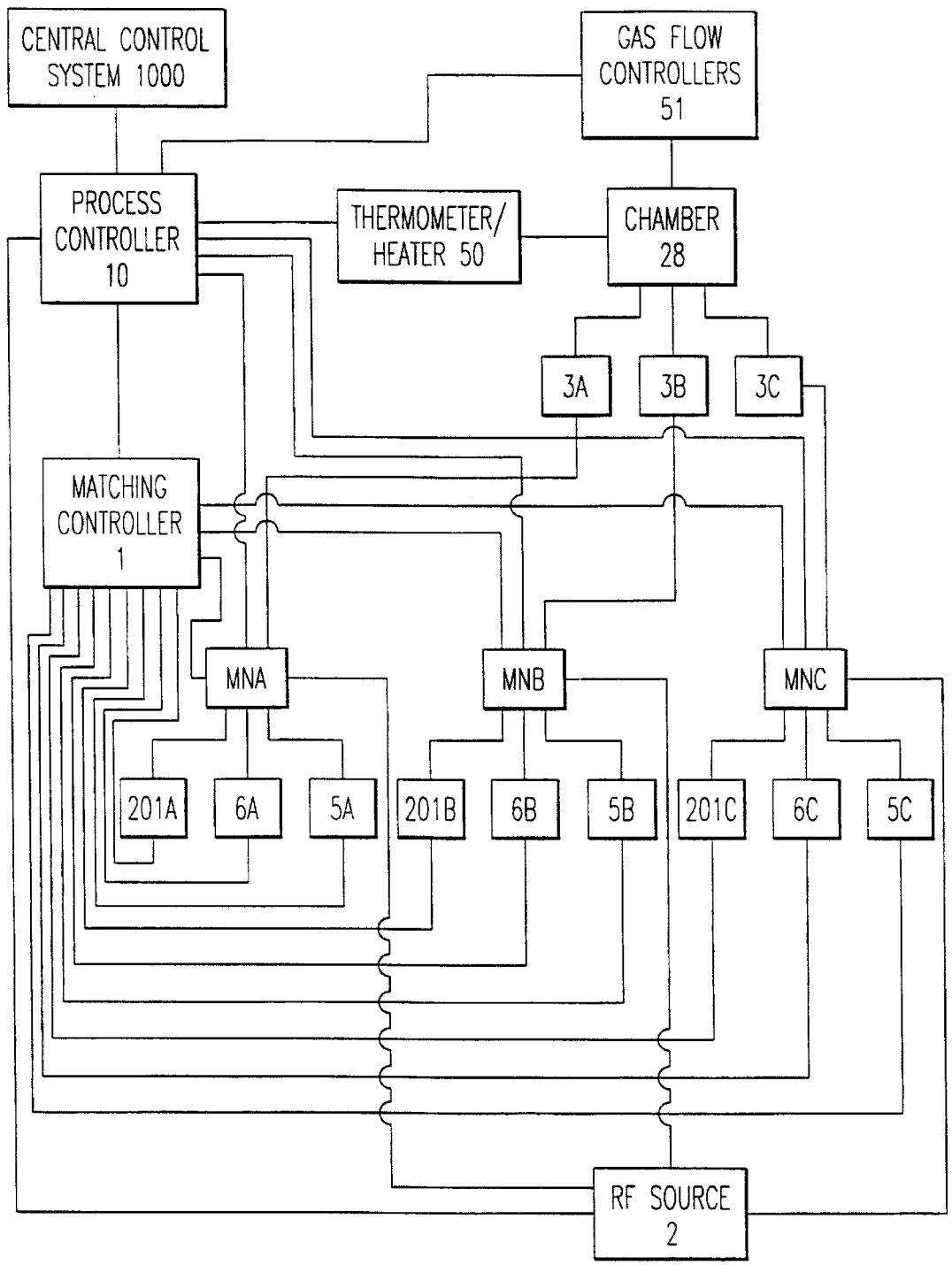
FIG. 3 is a block diagram of an embodiment according to the present invention in which a single matching controller controls plural matching networks.

Preferably, a process controller 10, shown in FIG. 3, controls all important aspects of the process, for example, the gas pressure, plasma chemistry, temperature (using a thermometer/heater represented as 50 in FIGS. 1 and 3), gas flow rate (using gas flow controllers 51, also illustrated in FIG. 3), RF power, and the mathematical parameters of the feedback control loops used by the matching controller.

The process controller preferably provides an interlock which prevents the RF power supplied to an inductive coil from being turned off before the power supplied to a capacitive plasma coupling element is turned off. In some inductively coupled systems, if a capacitive plasma coupling element (such as a bias shield or a wafer-holding chuck) is energized while the inductive element is not energized, severe arcing can occur, which can cause permanent damage to the system. According to one of the advantageous features of the invention, this situation is avoided, since the process controller prevents the power to the coil from being shut off before shutting off power to one or all of the remaining coupling elements.

Figure 11:
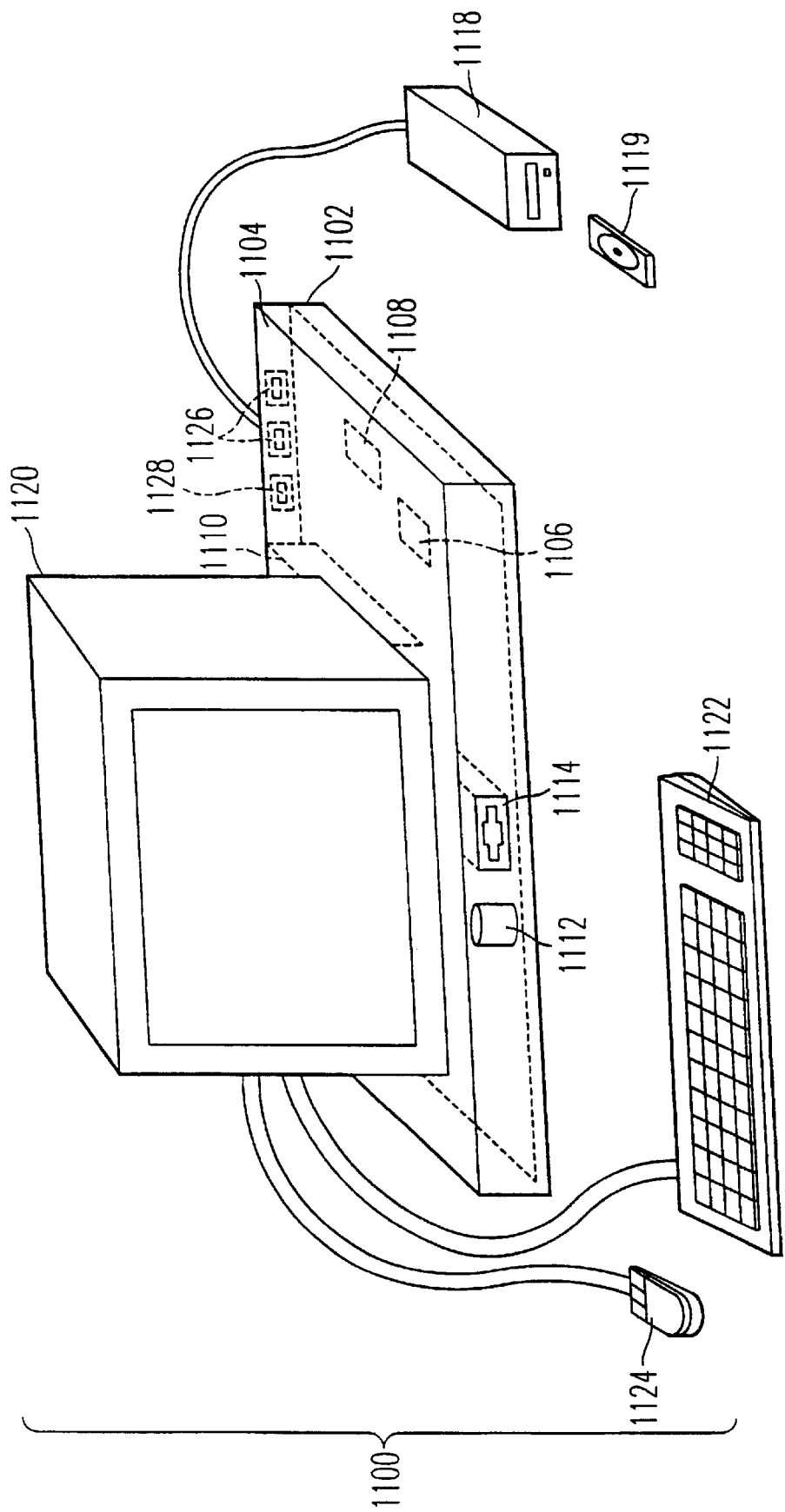
FIG. 11 is a schematic illustration of an example of a computer system for use as a matching controller or a process controller according to the present invention.

The process controller can be, e.g., a computer system, illustrated schematically in FIG. 11. The computer system 1100 has a housing 1102 which houses a motherboard 1104 which contains a CPU 1106 (e.g. Intel Pentium, Intel Pentium II, Dec Alpha, IBM/Motorola Power PC, memory 1108 (e.g., DRAM, ROM, EPROM, EEPROM, SRAM and Flash RAM), and other optional special purpose logic devices (e.g., ASICs) or configurable logic devices (e.g., GAL and reprogrammable FPGA). In addition, the computer system can have analog-to-digital (A/D) inputs 1126 for receiving information from the various detectors (i.e. the phase/amplitude detectors and forward/reflected power detectors) and other components of the plasma processing system. The computer also has a communication port 1128 for communicating with a central control system 1000 (FIG. 3) and the matching controller 1 (FIG. 3). The computer 1100 (FIG. 11) further includes plural input devices, (e.g., a keyboard 1122 and mouse 1124 ), and a display card 1110 for controlling monitor 1120. In addition, the computer system 1100 includes a floppy disk drive 1114; other removable media devices (e.g., compact disc 1119, tape, and removable magneto-optical media); and a hard disk 1112, or other fixed, high density media drives, connected using an appropriate device bus (e.g., a SCSI bus or an Enhanced IDE bus). Although compact disc 1119 is shown in a CD caddy, the compact disc 1119 can be inserted directly into CD-ROM drives which do not require caddies. Also connected to the same device bus or another device bus as the high density media drives, the computer 1100 may additionally include a compact disc reader 1118, a compact disc reader/writer unit or a compact disc jukebox. In addition, a printer also provides printed copies of important information related to the process, such as gas pressure, plasma chemistry, temperature, gas flow rate, RF power levels, quality of matching of the various plasma coupling elements, and the mathematical parameters of the feedback control loops used by the matching controller.

The computer system further includes at least one computer readable medium. Examples of such computer readable media are compact discs 1119, hard disks 1112, floppy disks, tape, magneto-optical disks, PROMs (EPROM, EEPROM, Flash EPROM), DRAM, SRAM, etc.

Stored on any one or on a combination of the computer readable media, the present invention includes software for controlling both the hardware of the computer 1100 and for enabling the computer 1100 to interact with a human user and a controlled system. Such software may include, but is not limited to, device drivers, operating systems and user applications, such as development tools and (graphical) system monitors. Such computer readable media further includes a computer program, according to the present invention, for operating the process controller.

The process controller can serve as a remote computer, and can allow an operator to "log on" to a host computer which may be a central control system 1000 (FIG. 3), and which may control not only this particular process but other processes in the fabrication line. The host computer, which can be of a form similar to the computer system of FIG. 11, can restrict the possible choices that the operator is allowed to make while performing the process, thus reducing the risk of operator error, and allowing for the employment of less-skilled operators without harmning the quality control of the process.

As should be apparent to those skilled in the art, the invention may be conveniently implemented using a conventional general purpose digital computer or microprocessor programmed according to the teachings of the present specification, as will be apparent to those skilled in the computer art. Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

In one embodiment of the invention, the matching controller 1 (FIG. 3) contains analog circuitry which receives, from each of the phase/amplitude detectors 5A–5C, a signal indicating the phase of the RF voltage at the input of each of the respective matching networks MNA-MNC. The matching controller 1 also contains circuitry to determine whether a given phase signal is outside of a predetermined range. If the phase is outside this range, the matching controller sends current into the motor controlling one of the tunable capacitors in the affected matching network, so as to adjust the capacitance, thereby changing the phase of the RF voltage being measured. The current is sent into the motor in a direction so as to adjust the phase of the voltage in the desired direction. In the present invention, the match controller mechanically adjusts capacitors C1 and C2 using servo-motors (e.g., as shown in the matching network of FIG. 9) based upon an error signal derived from the concurrent measurement of transferred and/or reflected power.

This continuous tuning operation (i.e., analog feedback control loop) ensures that the phase of the measured RF voltage is kept within the predetermined range. Since this phase is an indication of the quality of matching, the tuning operation can be used to maintain properly matched conditions.

Figure 9:
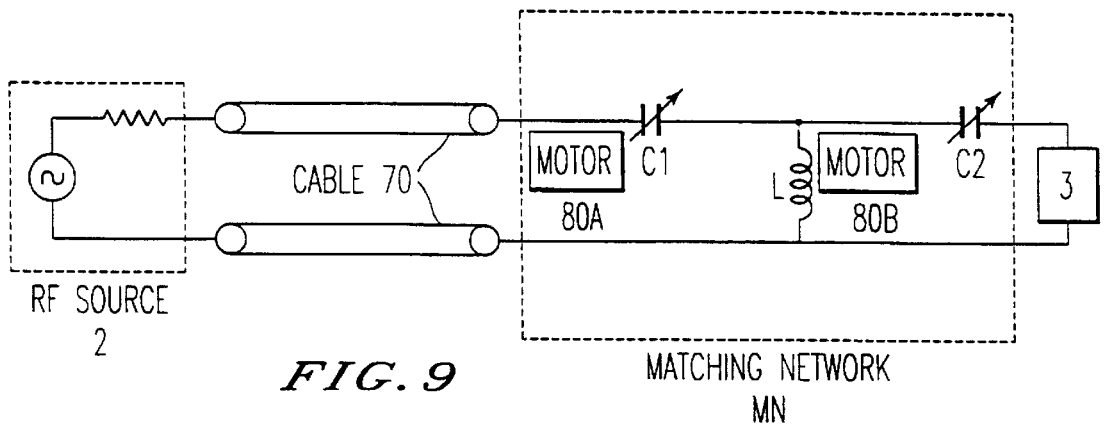
FIG. 9 is a circuit diagram of a matching network in a plasma processing system.

According to a preferred digital embodiment, the matching controller 1 (shown in FIG. 3) contains digital circuitry, and can optionally be of a form similar to the computer system of FIG. 11. The digital circuitry monitors signals from the position sensors 201A–201C (FIG. 3) on the tunable capacitors in the matching networks MNA-MNC, as well as the phase signals from the phase/amplitude detectors 5A–5C on the inputs of the matching networks. The position sensors indicate the values of the capacitors in the matching networks. The matching controller 1 uses this information, in addition to the phase and amplitude information received from the phase/amplitude detectors 5A–5C, to compute the optimum values of the capacitors in the matching networks. The matching controller 1 then sends current into the tuning motors (80; FIG. 9) so as to tune the variable capacitors (C, FIG. 9) to the desired values. Once the new values of capacitance have been obtained, the matching controller recalculates a set of updated capacitor values, based on new measurements of the phases and amplitudes of the voltages at the inputs of the matching networks. By repeating this operation, in the manner of a digital feedback control loop, the matching controller is able to converge (i.e., "zoom in") upon the optimum values of capacitance. In a presently preferred embodiment, the matching controller 1 contains a central processing unit (CPU), which performs the required calculations.

The digital circuitry allows the matching controller 1 to keep track of the conditions at all of the matching networks, to calculate the proper capacitances, and to tune each matching network accordingly. Therefore, problems such as instability of the convergence of the feedback control loop of the matching controller, and oscillation of the matching conditions, are prevented.

The matching controller may perform the above tuning operation on only one tunable capacitor at a time, so as to avoid interference between the tuning operation of one capacitor in the tuning operation of another capacitor. Alternatively, the matching controller 1 can perform the tuning operation on only one matching network at a time, but may simultaneously tune more than one capacitor within a given matching network.

The order in which the capacitors are tuned by the matching controller depends upon the specific process being performed. By way of example, consider a processing system with four capacitors, Ca and Cb in a first matching network, and Cc and Cd in a second matching network. Empirical results show that, for a first gas mixture, matching is performed most effectively if the capacitors are tuned according to a first sequence Ca, Cb, Cc, Cd. For a second gas mixture, matching may be performed most effectively if the capacitors are tuned according to a second sequence Cd, Cc, Ca, Cb. Therefore, the matching controller tunes the capacitors according to the first sequence for the first gas mixture, and according to the second sequence for the second gas mixture.

According to another advantageous feature of the invention, certain parameters of the matching networks can be predicted in a customized manner, depending on the type of process being controlled, and on the particular gas mixture (or recipe) of the plasma. For example, where experimental trials have suggested that, for a particular gas mixture, a particular set of matching network element parameters should be used for a particular length of time, until the plasma has been initiated, and a different set of matching network element parameters should be used after the plasma has been initiated, the matching networks utilize this information in actual processing runs. In accordance with this aspect, the process controller can use the previously determined information to automatically initiate the plasma and quickly tune the matching networks. The process controller first starts the plasma by tuning the matching elements of the matching networks to a first set of predetermined values for a first predetermined amount of time, then tunes the matching elements to a second set of predetermined values for a second predetermined amount of time, and then gives control of the matching elements to the feedback loop of the matching controller. The first set of predetermined matching element values is used to initiate the plasma. The second set of values serves as a "first guess" of the values most likely to lead to a properly matched condition. Once these values have been maintained for an appropriate or predetermined amount of time, as determined by earlier experimentation, control of the matching is released to the matching controller, which then activates its feedback control loop to fine-tune the matching conditions and obtain more accurate matching conditions. This automatic plasma initiation procedure achieves proper matching far more quickly than a manual tuning procedure. In addition, a skilled operator is not needed to monitor or control the system. In fact, in some cases, the system can be unattended, thus reducing labor costs, as well as the risk of operator error.

By way of example, consider a process in which a first step is performed with gas A and a second step is performed with gas B, and in which a single plasma coupling element and a single matching network are used. The matching network contains two tunable elements, e.g., capacitors C1 and C2. Further, by way of example, during the development stage of the process, it is empirically determined that gas A is most easily excited into a plasma when C1 equals 50 pF and C2 equals 50 pF. Once gas A has been excited into a plasma, proper matching conditions are usually obtained when C1 is approximately equal to 75 pF and C2 is approximately equal to 25 pF. In addition, it is determined that gas B is most easily excited into a plasma when C1 equals 30 pF and C2 equals 30 pF, and that, after a plasma has been initiated in gas B, proper plasma matching conditions are usually obtained when C1 equals 40 pF and C2 equals 15 pF. A manufacturing process according to this example would then be automated as follows:

The process controller 10 turns on the flow of gas A. The process controller 10 then sets C1 to 50 pF and C2 to 50 pF, and turns on the RF source, sending power through the matching network into the chamber. The two capacitors are maintained at these predetermined values for a preset amount of time, as empirically determined during the development stage, until a plasma is initiated. The process controller then adjusts the capacitor so that C1 equals 75 pF and C2 equals 25 pF, since these are the values expected to give the best matching condition. The process controller maintains the capacitors at these values for a predetermined amount of time, in order to allow the plasma conditions to stabilize. The process controller then releases control of the matching network to the matching controller, which begins to monitor the phase, amplitude, and forward and reflected power at the input of the matching network, as well as the signals from the position sensors attached to the capacitors. The matching controller enables its feedback control loop, in order to achieve a more accurate matching condition, as well as to adjust for minor changes in the plasma condition.

Once the first step of the process has been performed according to the process recipe for a predetermined amount of time, the RF power is turned off, the feedback control loop is disabled, and the flow of gas A is interrupted. The process controller then turns on the flow of gas B, sets the capacitors C1 and C2 to 30 pF, and turns on the RF power. As in the first step of the process, the plasma initiation values of the capacitors are maintained for a predetermined amount of time, after which capacitor C1 is set to 40 pF and capacitor C2 is set to 15 pF. The capacitors C1, C2 remain at these values for another predetermined amount of time, at which point the process controller 10 returns control of the capacitors to the matching controller 1 which, once again, assumes the task of fine-tuning the capacitors, and adjusting them to accommodate changes in the plasma condition.

Proper matching network conditions for initiating a plasma (plasma initiation conditions) and for sustaining a plasma (first guess capacitor values) can be obtained by manual experimentation, or by an automated experimental procedure. The automated procedure can be performed by the process controller. In a preferred embodiment, the process controller 10 tests a variety of values of the tunable elements in the matching networks, in order to determine which conditions are most effective (e.g., which conditions require the least amount of incident power) for initiating the plasma. Also, the process controller may test a variety of different element values after plasma initiation, in order to determine which parameter values tend to provide the best matching conditions.

Figure 10:
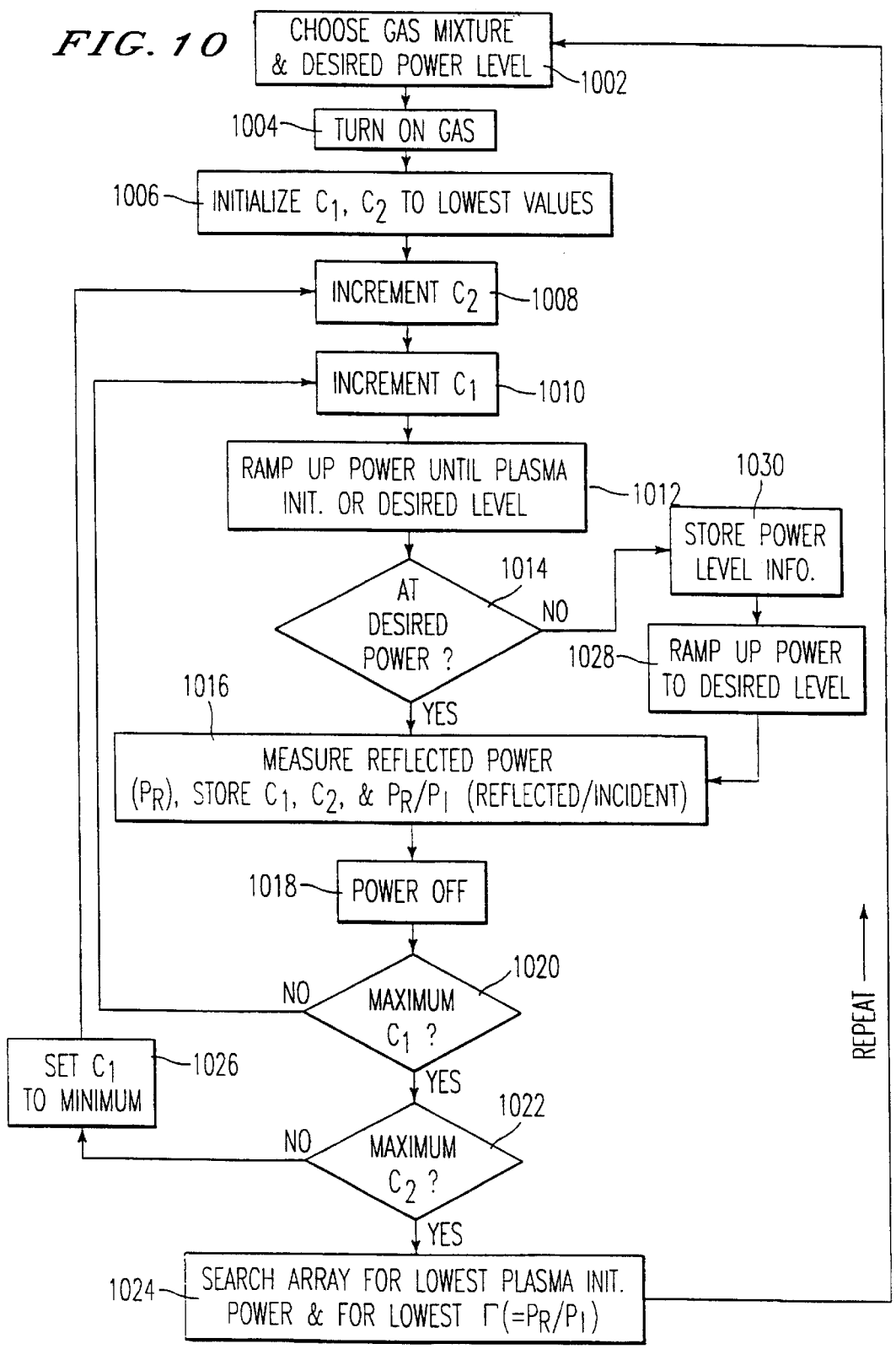
FIG. 10 is a flowchart of a procedure for determining optimum values of tunable elements in a matching network, in order to properly initiate and sustain a plasma, according to the present invention.

An exemplary automated procedure for obtaining proper matching network plasma initiation conditions and first guess capacitor values (i.e., matching network plasma sustaining conditions) is represented by the flowchart in Figure 10. The system in this example includes two tunable capacitors C1 and C2. For a variety of different values of C1 and C2, the procedure determines both the power required for plasma initiation and the reflection coefficient Γ (reflected power divided by incident power). First, the desired gas mixture and desired power level are chosen (step 1002). Next, the gas is turned on (step 1004) and C1 and C2 are initialized to their starting values (step 1006). In this example, C1 and C2 are initialized at low values and incremented as the test proceeds. In steps 1008 and 1010, C2 and C1 are inceimented by predetermined amounts to the lowest values being tested. Then, the power from the RF power source is increased until either a plasma is initiated or the power reaches the desired level (step 1012). If the power is not at the desired level (step 1014), the process controller records the current power level as the power required for plasma initiation using the current values of capacitors C1 and C2 (step 1030).

Next, the power is increased to the desired power level (step 1028) and the reflected power is measured (step 1016). In step 1016, the process controller stores the values of C1, C2, and reflection coefficient Γ (i.e., $P_R/P_I$) If, at step 1014, the system has already reached the desired power level, the procedure skips immediately to step 1016, bypassing steps 1030 and 1028. After the power and capacitance data has been stored, the power is turned off (step 1018) and the value of C1 is checked to determine whether it is at its maximum (step 1020). If not, the procedure returns to step 1010, at which C1 is increased and the testing continues with the new value of C1. If, in step 1020, capacitor C1 is at its maximum value, then capacitor C2 is checked to determine whether it is at its maximum value (step 1022). If not, capacitor C1 is set to its minimum value (step 1026) and the procedure returns to step 1008, at which point C2 is increased to a new value and the testing continues. If, in step 1022, C2 is at its maximum value, this indicates that the process controller has finished collecting data for this particular gas mixture and desired power level.

During the testing procedure, the data is organized into an array containing required plasma initiation power levels and measured reflection coefficients (Γ) for a range of different values of C1 and C2. The process controller searches this array to find the values of C1 and C2 which require the least amount of plasma initiation power (step 1024). The process controller also searches the array to find the values of C1 and C2 which provide the lowest value of Γ (also step 1024). The procedure is then repeated, starting from step 1002, for every gas mixture and desired power level of interest, according to the preferences of the operator. In this example, the procedure in FIG. 10 is performed for combination of gas mixture and incident (i.e., forward) power to determine the matching network plasma initiation and matching network plasma sustaining conditions.

Another feature of the invention is that the central process controller can monitor the respective matching parameters during the course of actual operation, in order to "learn" which matching parameters tend to provide the best matching conditions. This information may be used to more quickly achieve matching during, and immediately following, plasma initiation, by providing more effective plasma initiation, and by improving the accuracy of the first guesses of the values of the elements in the matching networks. One embodiment of an intelligent controller is a fuzzy logic system as described below with reference to FIGS. 12A–12G. In addition, the system can also "learn" by using a neural network trained with empirical data and a set of desired results.

This information may also be advantageously used to allow the process controller to detect large deviations between the expected and actual values of the matching elements during a process. If such deviations are detected, the process controller may indicate to a human operator or to a central control system 1000, shown in FIG. 3, that there is a problem with the processing system. This provides a method for diagnosing problems in the processing system in order to ensure the quality of the work product and, in extreme cases, to avoid damage to the components in the system. In a preferred embodiment, the process controller 10 performs a daily diagnostic test of the system in order to verify that the observed values of the matching elements, as determined by the feedback control loop of the matching controller, do not deviate more than a predetermined limit from the expected values. If these values deviate more than the specified limit, a warning is given to a human operator or to the central control system, indicating that the processing system requires maintenance.

Figure 4:
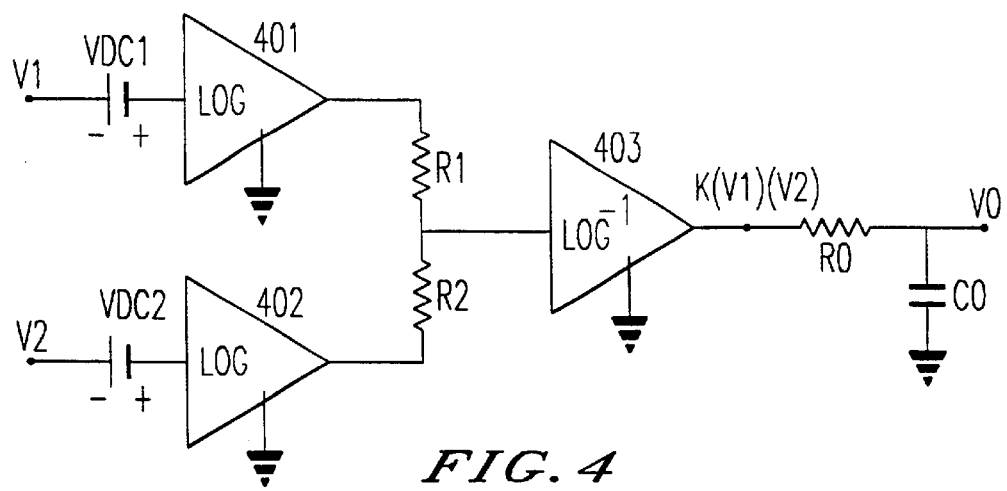
FIG. 4 is a circuit diagram of a four quadrant multiplier phase detector according to the present invention.

Another feature of the invention is shown in FIG. 4, which is a schematic diagram of a four quadrant multiplier phase detector. In this arrangement, a voltage V1 and a voltage V2 are each sent into logarithmic amplifiers 401 and 402, respectively. The outputs of the amplifiers 401 and 402 (which represent the respective logarithms of V1 and V2) are sent into a circuit including resistors R1 and R2, in order to add the logarithmic signals. The resulting, summed signal is sent into an antilogarithmic amplifier 403 so as to provide an antilogarithm (i.e., inverse logarithm) of the summed signal. The output signal of the antilogarithmic amplifier contains the product of voltages V1 and V2, multiplied by a constant, wherein the constant is dependent upon the gains of the respective amplifiers and the values of R1 and R2. Since the logarithmic amplifiers 401 and 402 can only accommodate positive input signals, DC bias voltages VDC1 and VDC2 can be added to V1 and V2, respectively, in order to insure that logarithmic amplifiers 401 and 402 never receive negative signals. The output signal from antilogarithmic amplifier 403 may be filtered with a low-pass filter in order to remove high frequency components. An example of such a filter, which includes a resistor RO and a capacitor CO, is shown in FIG. 4. As is known in the art, the DC component of the product of two non-DC signals is proportional to the relative phase of the two signals. Therefore, the output voltage VO of the circuit in FIG. 4 provides an indication of the relative phase of voltages V1 and V2. While this circuit is extremely sensitive to small signals, and provides an accurate reading, it is also tolerant of large signals, and is less susceptible to heating, drift, and damage problems which can occur in the mixer circuits commonly used in conventional systems. Since it can accommodate large signals without sacrificing sensitivity to small signals, the circuit in FIG. 4 provides higher dynamic range than conventional phase detector circuits.

Figure 5A:
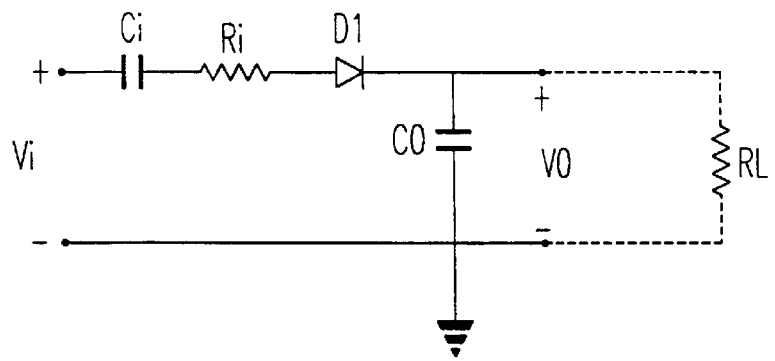
FIG. 5A is a circuit schematic of a conventional peak detector.

FIG. 5A illustrates a peak detector circuit utilized in conventional systems. In this arrangement, a changing voltage Vi is applied to the input of the circuit. As voltage Vi rises, current flows through capacitor Ci, resistor Ri, and diode D1, charging capacitor CO. Current will continue to flow in this direction until Vi stops increasing. The voltage VO, across capacitor CO and load RL, is approximately equal to the maximum voltage achieved by Vi, minus the turn-on voltage of diode D1. Once Vi starts falling, current is unable to flow in the reverse direction, because diode D1 is reverse-biased. This prior art circuit has a limited dynamic range because the output voltage VO is always slightly less than the true, maximum voltage attained at the input, due to the turn on voltage of diode D1. At small signal levels, this turn on voltage becomes significant compared to the signal level, and introduces a large error.

Figure 5B:
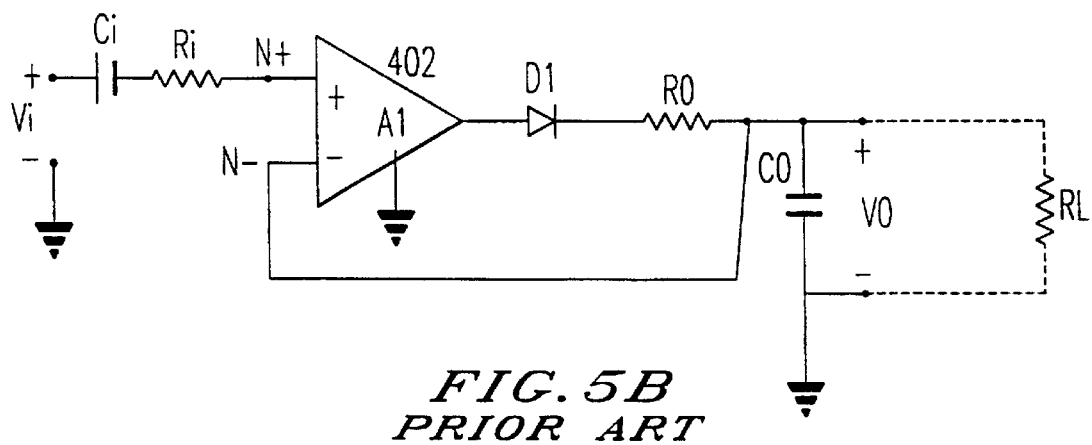
FIG. 5B is a circuit schematic of a high speed active peak detector according to the present invention.

The above problem is solved by the feature of the invention illustrated in FIG. 5B, which shows a schematic view of a high speed active peak detector. The circuit operates as follows. An input signal Vi is applied to the input of the circuit. This input voltage is coupled to a positive terminal N+ of the input of an amplifier A1, through a capacitor Ci and a resistor Ri. A negative terminal N− of the input of amplifier A1 is connected directly to the output voltage VO of the circuit. As long as the voltage on N+ is greater than the voltage on N−, amplifier A1 will continue to send positive current through diode D1 and resistor RO, charging capacitor CO and increasing VO. Since voltage Vi, at least at high frequencies, is approximately equal to the voltage on N+, amplifier A1 will cease to charge CO only when VO is approximately equal to, or greater than, Vi. Therefore, VO is approximately equal to the highest voltage attained at the input of the circuit. For small signals, this circuit is more sensitive and accurate than the prior art circuit in Figure 5A, because the gain of A1 effectively minimizes the effect of the turn-on voltage of diode D1.

The circuits in FIGS. 5A and 5B respond to an increasing input voltage with a time constant dependent on the values of CO, RO, and the output load resistance RL. The time constant of the circuit in FIG. 5B is also influenced by the value of RO. Both circuits are designed so as to slowly reset themselves to a lower output voltage if the RF voltage at the input is reduced in amplitude for a time larger than 1/(RL× CO). It should be noted that both of these circuits are capable of measuring only the positive half of the RF cycle. In either case, measurement of the negative half of the RF cycle requires a similar, complementary circuit, which can be obtained by reversing the polarity of diode D1.

Figure 6A:
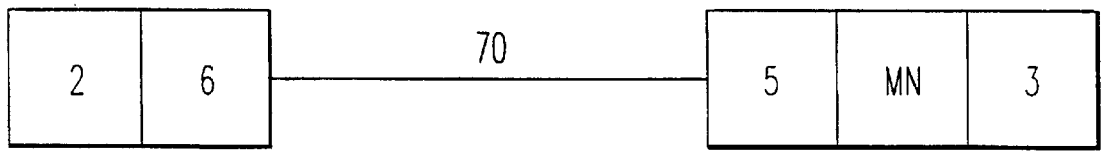
FIGS. 6A–6C are block diagrams of power indicators and their positions according to a known system and that of the present invention.

FIG. 6A illustrates the placement of a forward and reflected power detector immediately at the output of an RF source, as utilized in conventional systems. The RF signal coming from an RF source 2 is sent into a power detector 6, from which it is sent through a cable 70 to a phase/amplitude detector 5, and then into a matching network MN. The matching network couples the power into a plasma coupling element 3. The disadvantage of this system is that the power meter usually does not give an accurate indication of the incident and reflected power at the input of the matching network, due to lack of knowledge or lack of consistency of the properties of the cable. This problem can be caused by poor characterization of the cable or, more commonly, by damage to the cable.

Figure 6B:
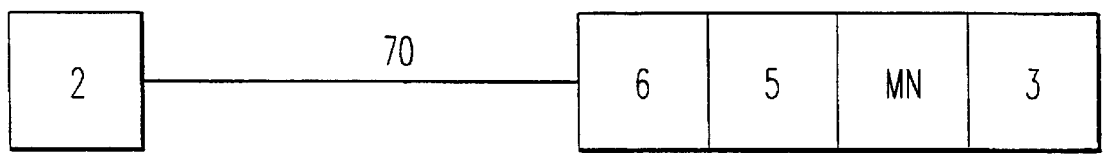

The shortcomings of conventional systems are eliminated by the aspect of the invention shown in FIG. 6B, which illustrates a method of placing a forward and reflected power detector at the end of a cable which is closest to the matching network. Power is sent from an RF source 2 through a cable 70 into a power detector 6, then into a phase/amplitude detector 5, and then into a matching network MN. The matching network couples the power into a plasma coupling element 3, which delivers it to the plasma. Because the power detector is located extremely close to the matching network, more accurate readings of the forward (i.e. incident) and reflected power can be obtained. Errors introduced by cable effects are eliminated.

Figure 6C:
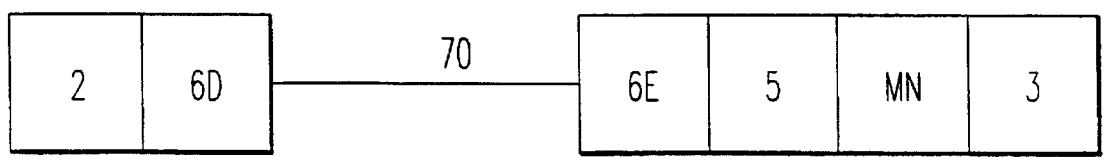
Figure 8A:
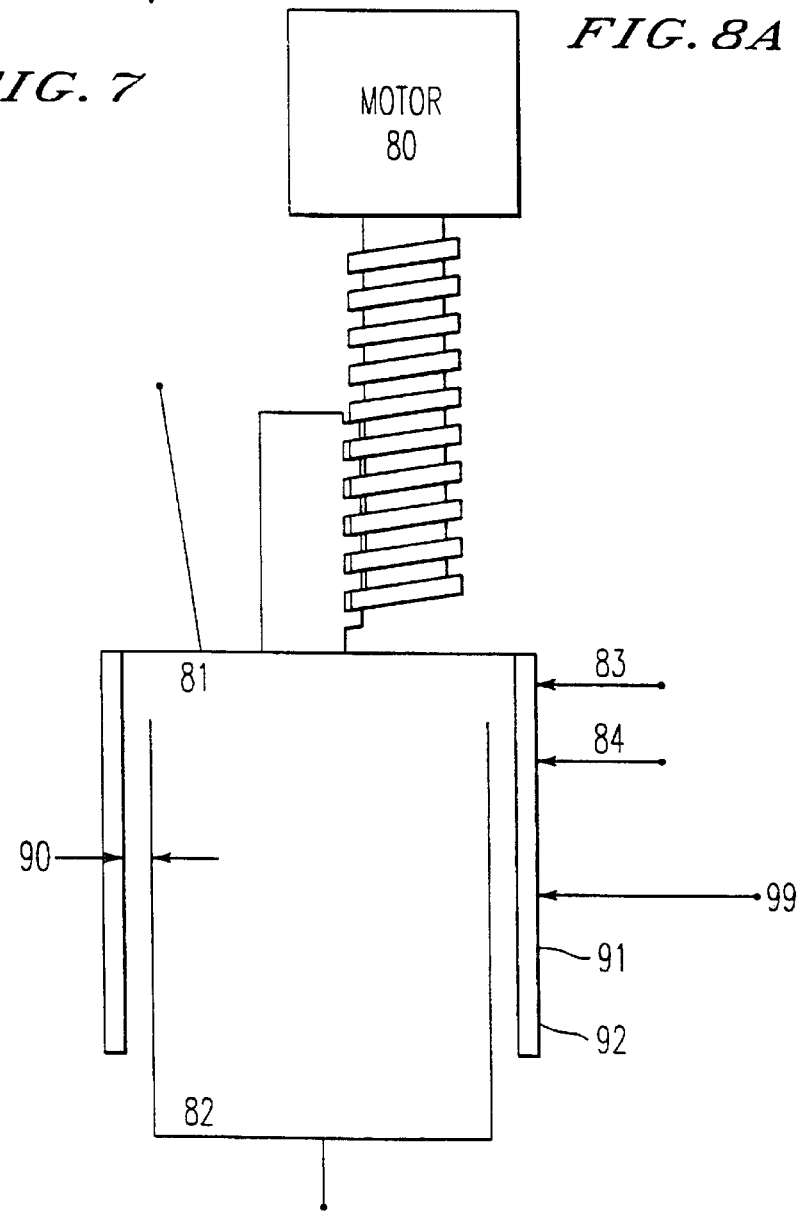
FIG. 8A is a block diagram of a limit switch on a variable capacitor according to an embodiment of the present invention.
Figure 8B:
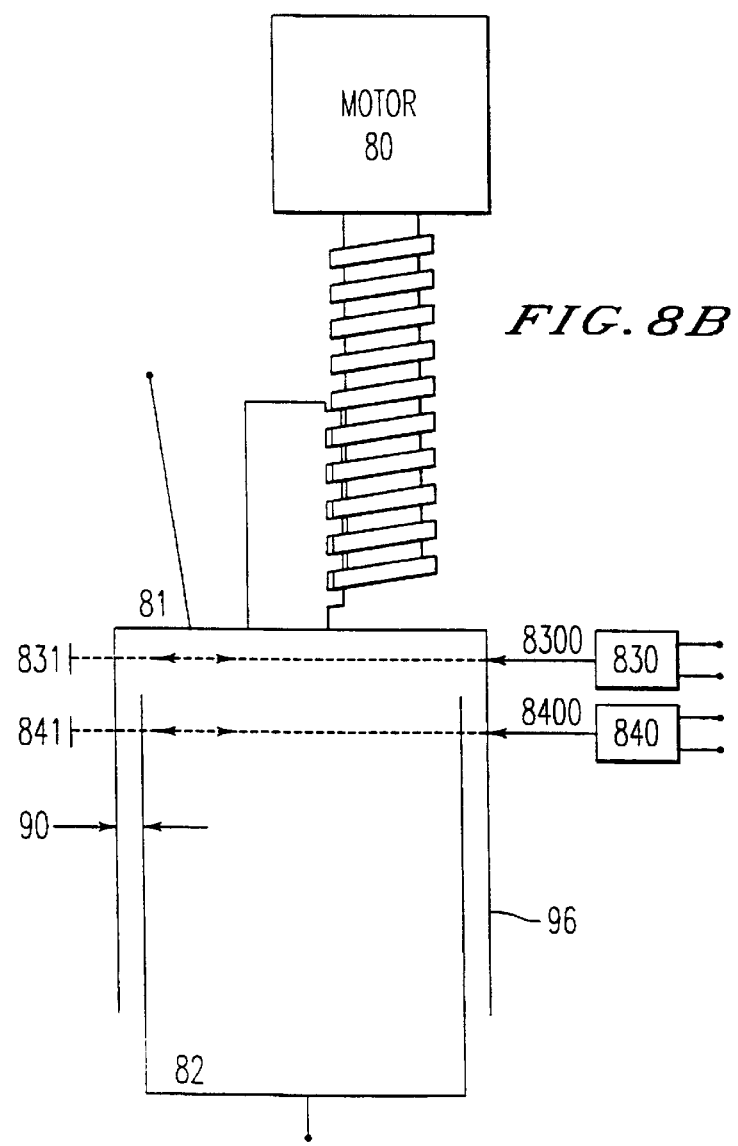
FIG. 8B is a block diagram of a limit switch on a variable capacitor according to another embodiment of the present invention.

In another embodiment of this feature, two power detectors 6D and 6E are used, one located immediately at the output of an RF generator 2 and the other disposed at the other end of a cable 70, as illustrated in FIG. 6C. One advantage of this embodiment is that, by In another embodiment of this feature, illustrated in FIG. 8B, optical sensors 830 and 840 are disposed so as to detect when one of the electrodes 81 and 82 (separated by gap 90) has been moved too far (in this example, electrode 81 is moved). This may be done by means of a reflective coating 96 on electrode 81, in which case optical sensors 830 and 840 would detect the position of electrode 81 by means of the reflection of light beams 8300 and 8400. Alternatively, additional reflectors 831 and 841 may be disposed so as to reflect light beams 8300 and 8400 unless these beams are blocked by electrode 81. The signals coming from optical sensors 830 and 840 can be sent to either the matching controller or the process controller, in order to shut off the motor 80, so as to prevent damage to the capacitor. While the physical limit switches shown in FIGS. 8A and 8B represent examples of possible embodiments of these switches, these devices may be constructed in numerous alternative ways.

The movement of the capacitors is controlled by the overall process shown in FIGS. 12A–12G. Although the control is described in terms of utilizing a fuzzy controller, it would be readily apparent that the control can be implemented with a properly trained neural network also. The neural network would learn the non-linear response of the matching network from empirical data and a set of desired responses. Likewise, in an alternate embodiment, a series of fuzzy controllers or neural networks are provided, each configured or trained to control a particular process rather than a particular machine. In this embodiment, the appropriate fuzzy controller or neural network is chosen, either manually or automatically, depending on which controller most closely matches the process parameters. Likewise, in an alternate embodiment, a fuzzy controller is used for one process and a neural network for another. The remaining discussion is given in terms of a single fuzzy controller only for clarity, but should not be deemed as limiting.

In one embodiment, the master is connected to the helix and controls slave devices (which are also controllers connected to other RF sources such as the bias shield and the chuck). Each slave monitors applied and reflected power from the master. If the reflected power from the master exceeds a threshold, e.g., 5 watts, the slaves disable tuning motors on the bias and the chuck to prevent tuning interactions, allowing the master to tune the helix for zero reflected power. comparing the signals from the two power detectors, information can be obtained regarding the properties and condition of the cable.

Figure 7:
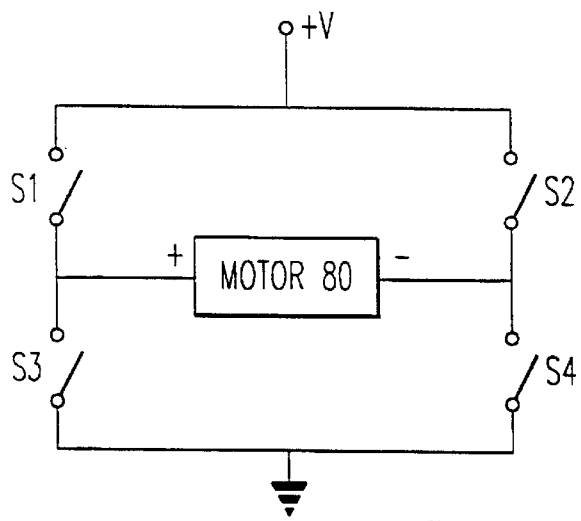
FIG. 7 is a block diagram of a servomotor control circuit according to the present invention.

According to another aspect of the invention shown in FIG. 7, a circuit is used to control a servomotor 80 which tunes a matching element, such as a variable capacitor, according to the invention. A voltage V is applied to the circuit. To drive the motor in a forward direction, switches S1 and S4 are closed, sending current through the motor in a forward direction. To drive the motor in a reverse direction, switches S2 and S3 are closed, sending current through the motor in a negative direction. This circuit drives the motor at a maximum acceleration in either direction. Due to the simplicity of the circuit, it can be implemented extremely inexpensively and reliably using a variety of different switches, such as transistors or relays. The same is not true for the pulse width modulation (PWM) circuits employed in conventional systems.

The servomotor control aspect of the invention has an additional feature, shown in FIGS. 8A and 8B. These figures illustrate two different physical limit switches for variable capacitors. In FIG. 8A, a capacitor plate 82, which may be cylindrical, fits inside another capacitor plate 81, and the plates are separated by a gap 90. The gap may contain a vacuum, or it may be filled with air or a dielectric. To increase the capacitance of the capacitor, one or both of the electrodes is moved by a motor 80, so that electrode 82 is disposed farther inside of electrode 81. An insulating layer 91 is disposed on the surface of electrode 81, and a conductive layer 92 is disposed upon insulating layer 91. Brush contacts 83 and 84 are disposed so as to electrically contact conducting layer 92 when electrode 81 is within its acceptable range of travel. If electrode 81 travels too far, the contact with either one, or both, of the brush contacts is broken.

The brush contacts are connected to the matching controller which, when it senses that contact is broken, will stop turning the motor so as to prevent damage to the capacitor. Alternatively, conducting layer 92 may also be connected to separate terminal 99, in which case an open circuit at brush contact 83 can be detected independently of an open circuit at brush contact 84, and vice versa. This allows the matching controller, or the process controller, to determine in which direction the limit of motion of electrode 81 has been exceed.

Figure 12A:
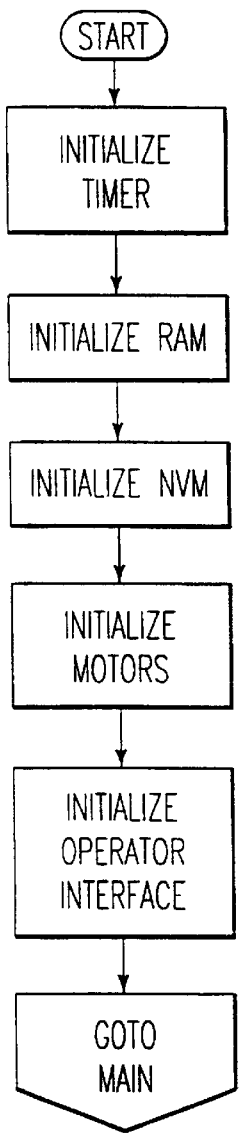

In FIG. 12A, the system is initialized in preparation for operation. The timers, RAM, non-volatile RAM (NVM or NVRAM), motors, and operator interfaces are all initialized before control passes to the main processing loop of FIG. 12B.

Figure 12B:
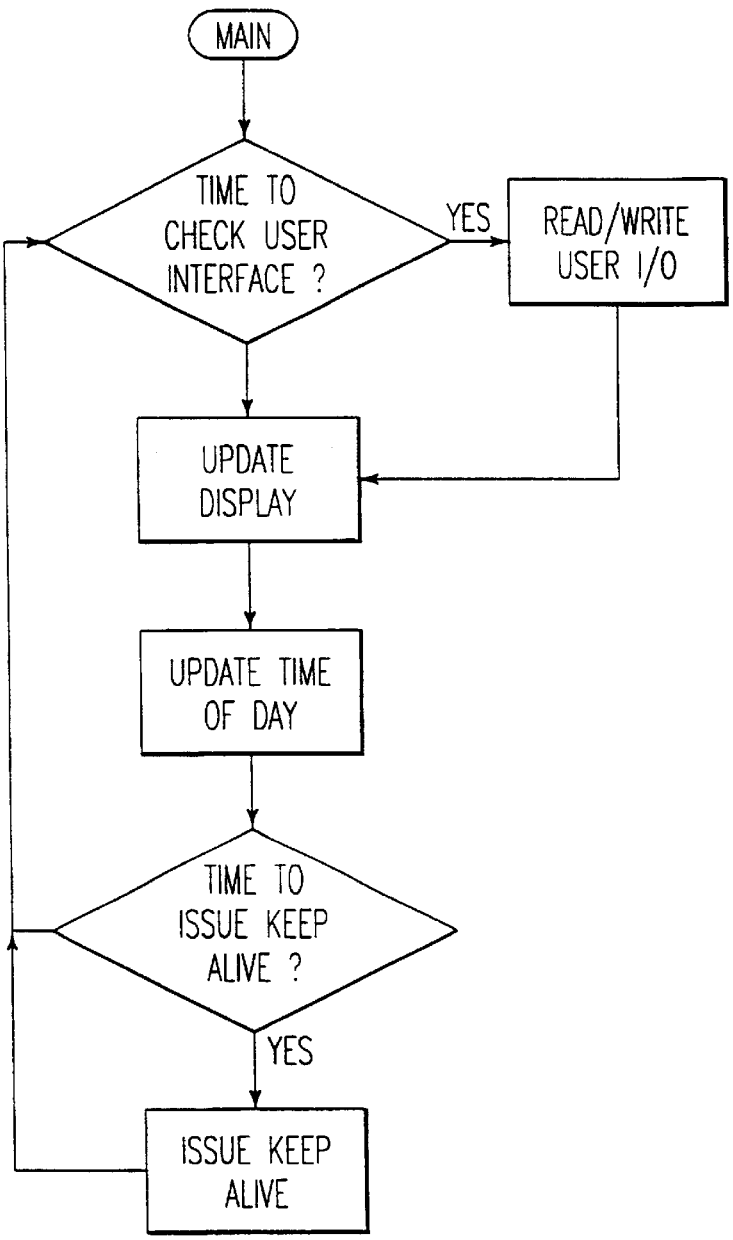

As shown in FIG. 12B, the main loop includes a series of repeated steps which are repeated during the operation of the matching network system. Periodically the master system checks the user interface looking for input from the user. This input is usually in the form of keystrokes on a keyboard and mouse movements or selections, but also includes any other type of user input, e.g., wireless controls and glove controls. The display is updated in the loop, to reflect any changes caused by the input from the user or a change in the status of the system. The time of day is also updated so that periodic control functions can be performed at appropriate intervals. Also, periodically the master system sends messages to slave devices to make sure that the slave devices are operating correctly. These slave devices are network components that must be matched to the current operating conditions. The status of how well each component is matched is returned to the main system which controls changes according to the direction of the fuzzy controller (or neural network controller).

Figure 12C:
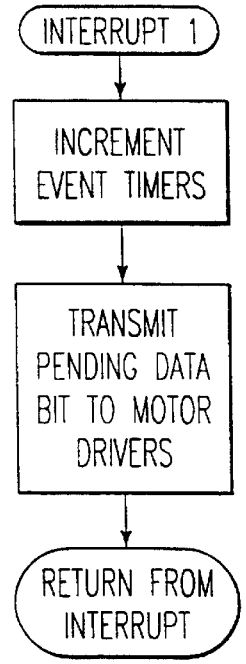

In FIG. 12C, an installed interrupt service routine (ISR) is run in response to the expiration of an event timer, such as a real-time clock. The ISR is run and the event timer is incremented. The event timer helps to control when the next periodic event is executed. Also, the ISR also sends control signals to the motor drivers to adjust the positions of the capacitors, thereby changing the matching of the system.

Figure 12D:
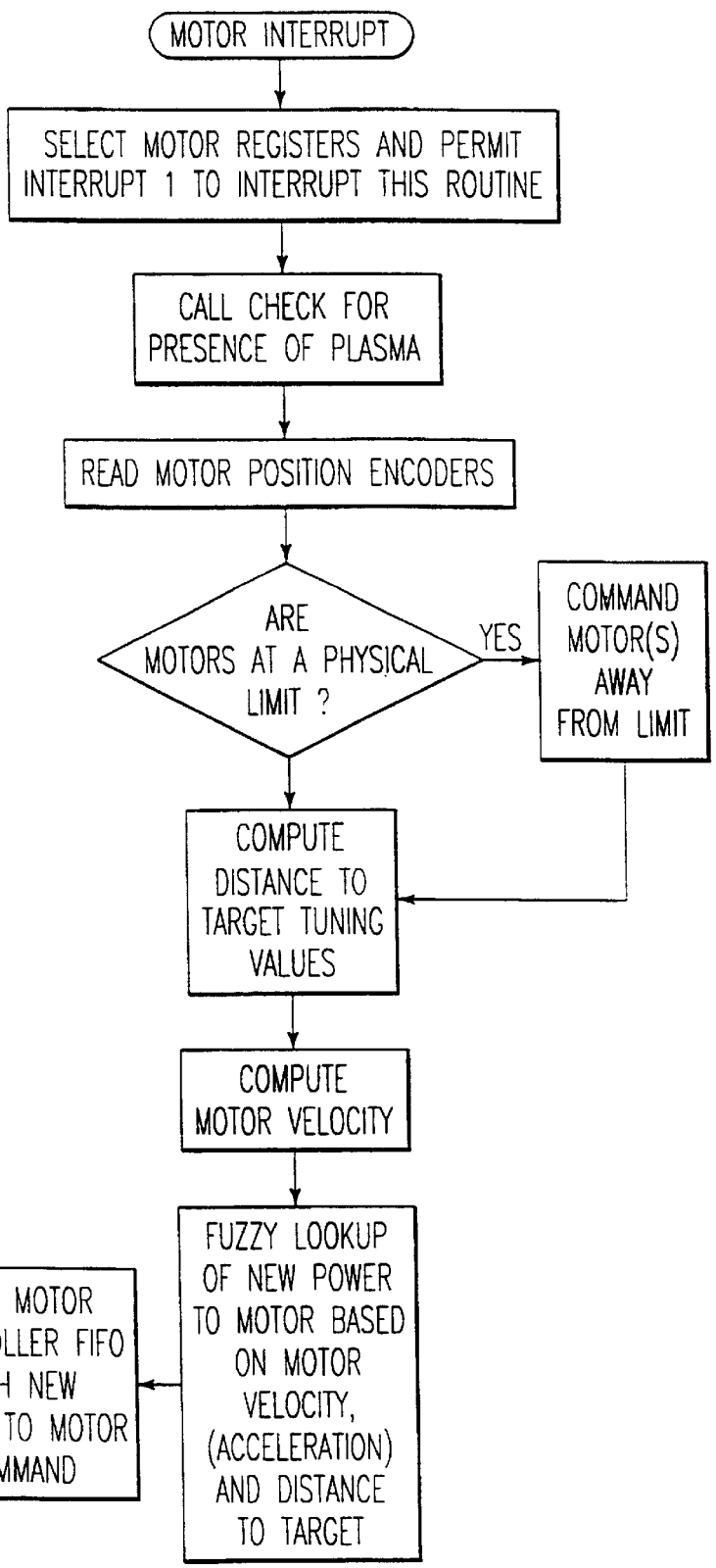

FIG. 12D shows a second ISR for controlling the motors of the slave devices. When the master system executes the motor ISR, it selects motor registers and enables interrupts. Control then passes to the step which checks for the presence of a plasma and the step that reads the motor position encoders. In one embodiment, the encoders are read by reading a voltage from a following potentiometer connected to the motor driven capacitor. However, other methods of determining position are also possible, such as a rotational encoder which determines a number of partial turns with reference to a fixed position. If any of the motors are found to be at a physical limit, the motors are instructed to move away from the physical limit. Subsequently, the system determines a distance that each motor is away from a target tuning value. The distance can be either positive or negative depending on whether the motor has to be driven forward or backward to meet the target.

After the distance to the target tuning value is determined, the system determines a motor velocity since the motor may already be in motion. The distance and velocity are applied as inputs to the fuzzy (or neural network) controller to generate a new motor drive control signal. In addition, in an alternate embodiment, the system also uses the acceleration of the system as an input to provide finer control over the motor motion. The motor drive control signal is output to the motor. In one embodiment, the control voltage setting is applied to a first-in, first-out (FIFO) memory device which stores whether a voltage should be applied at the next timer interval. The motor ISR is then complete.

As described with reference to FIG. 12D, the second step of the motor ISR is to check for the presence of a plasma. FIG. 12E is a flowchart which shows the checking process. If the system is not in the "autorun" mode, the check is complete. However, if the autorun mode is selected, the plasma sensor data is read and the motors are controlled according to whether the system is in start mode or in run mode.

Figure 12F:
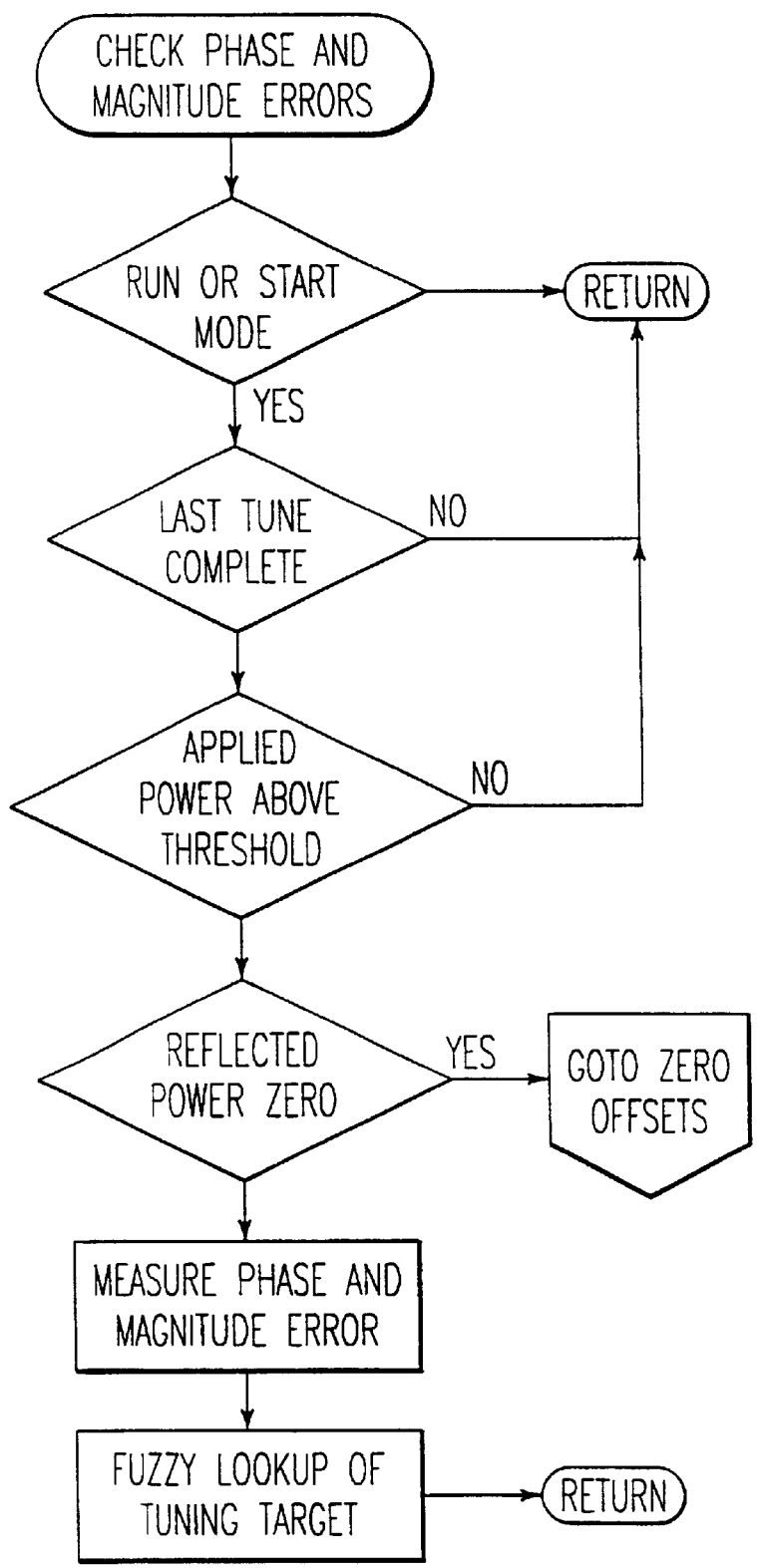
Figure 12G:
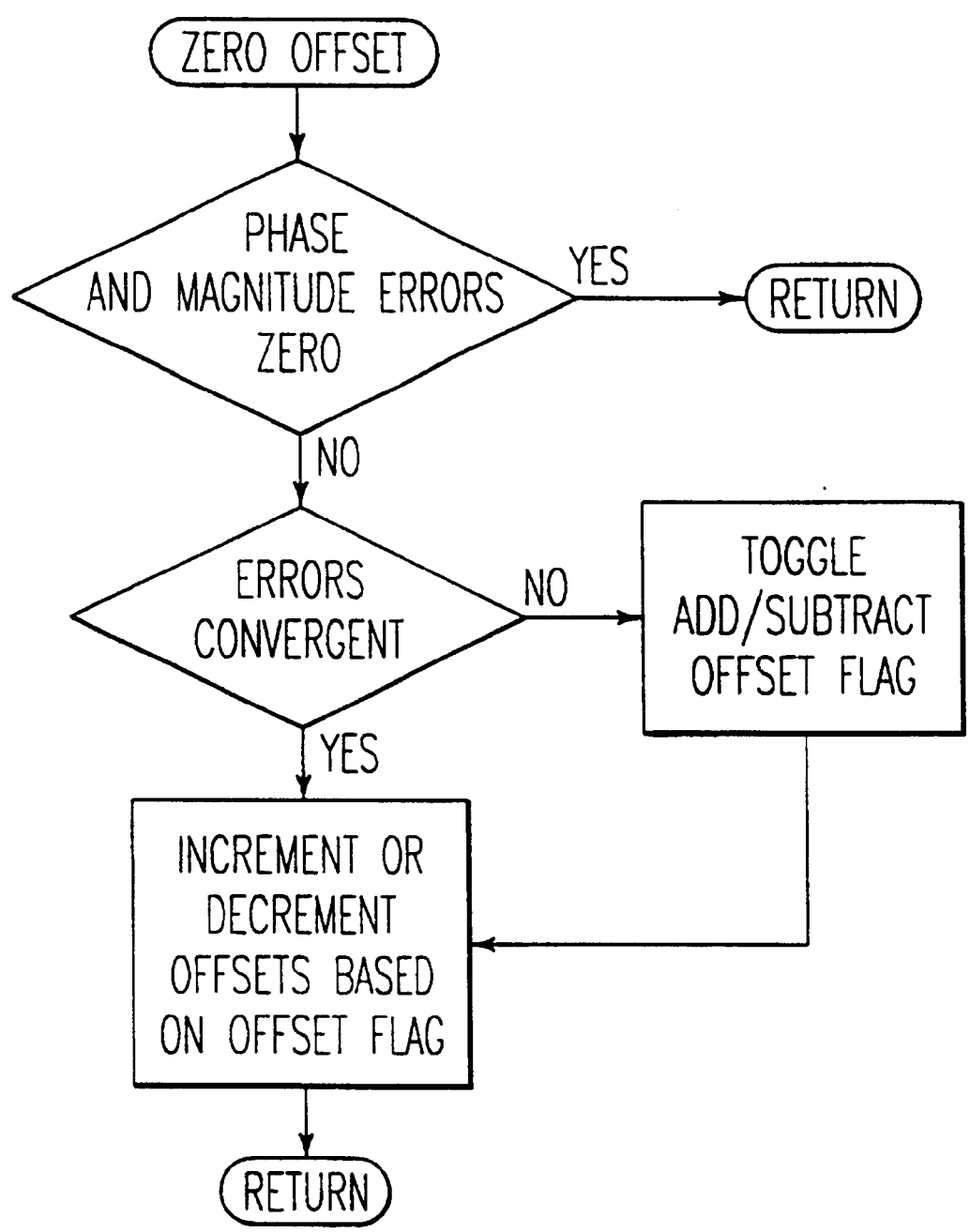

As shown in FIG. 12F, the master system also checks for phase and magnitude errors as described above. When doing so, the master system determines that it is in run or start mode before proceeding. Further, it only proceeds if the last tune is complete and the applied power is above a threshold. If there is reflected power, the system zeroes the offsets as is described below with reference to FIG. 12G. If there is (essentially) no reflected power, the system measures the phase and magnitude errors. It then performs a fuzzy (neural) control of the tuning target as described above.

When the master system determines that there is reflected power, it determines if there is also a magnitude or phase error. If so, the offset does not need to be zeroed. If there is no phase or magnitude error, the system determines if the errors are convergent. If not, the system toggles the add/subtract offset flag. Subsequently, regardless of whether or not the errors are convergent, the system increments (or decrements depending on the add/subtract offset flag) offsets. then offset zeroing process is then complete.

As discussed above, in one embodiment of the present invention, the fizzy controller of the present invention utilizes two input variables, (1) the distance to a target position, and (2) a present speed of the motor. The position input variable is assigned five possible functions: neg_close, zero, close, medium, and far. The range of the position input variable is −5 volts to +5 volts when the distance is measured with a following potentiometer. The normalized assigned functions are given by the table below:

| Term name | Shape | Definition Points |
| --- | --- | --- |
| neg_close | linear | (−5, 1) (−0.81, 1) (0.03, 0) (5, 0) |
| zero | linear | (−5, 0) (−0.81, 0) (0.03, 1) (0.54, 0) (5, 0) |
| close | linear | (−5, 0) (0.03, 0) (0.54, 1) (1.7, 0) (5, 0) |
| medium | linear | (−5, 0) (0.54, 0) (1.7, 1) (3.7, 0) (5, 0) |
| far | linear | (−5, 0) (1.7, 0) (3.7, 1) (5, 1) |

Likewise, the speed input variable, called derivative, is assigned five possible functions: pos_big, pos_small, zero, neg_small, and neg_big. The range of the speed input variable is −5 V/sec. to +5 V/sec. The normalized assigned functions are given by the table below.

| Term name | Shape | Definition Points |
| --- | --- | --- |
| pos_big | linear | (−5, 0) (0.59, 0) (3.3, 1) (5, 1) |
| pos_small | linear | (−5, 0) (0, 0) (0.59, 1) (3.3, 0) (5, 0) |
| zero | linear | (−5, 0) (−0.55, 0) (0, 1) (3.3, 0) (5, 0) |
| neg_small | linear | (−5, 0) (−3.3, 0) (−0.55, 1) (0, 0) (5, 0) |
| neg_big | linear | (−5, 1) (−3.3, 1) (−0.55, 0) (5, 0) |

The motor control output variable, called motor_voltage, also is assigned five output functions: pos_high, pos_medium, zero, neg_medium, and neg_high. The range of the motor control output variable is −12 volts to +12 volts. The normalized assigned functions are given by the table below.

| Term name | Shape | Definition Points |
| --- | --- | --- |
| pos_high | linear | (−12, 0) (4, 0) (9.4, 1) (12, 0) |
| pos_medium | linear | (−12, 0) (0.1, 0) (4, 1) (9.4, 0) (12, 0) |
| zero | linear | (−12, 0) (−2.8, 0) (0, 1) (9.4, 1) (12, 0) |
| neg_medium | linear | (−12, 0) (−9.6, 0) (−2.8, 1) (0.1, 1) (12, 0) |
| neg_high | linear | (−12, 0) (−9.6, 1) (−2.8, 0) (12, 0) |

Further, the nine fuzzy rules of the system are given below.

1. If position is zero and derivative is pos_small then motor_voltage is neg_medium.

2. If position is zero and derivative is zero then motor_voltage is zero.

3. If position is close and derivative is pos_small then motor_voltage is neg_medium.

4. If position is close and derivative is zero then motor_voltage is neg_medium.

5. If position is close and derivative is neg_small then motor_voltage is pos_medium.

6. If position is medium and derivative is neg_small then motor_voltage is pos_high.

7. If position is medium and derivative is neg_big then motor_voltage is pos_medium.

8. If position is far and derivative is zero then motor_voltage is pos_medium.

9. If position is far and derivative is neg_small then motor_voltage is pos_high.

As should be readily apparent from the foregoing, the invention includes a number of features which are advantageous over conventional matching systems. For example, by utilizing a single controller which controls multiple matching networks, improved, more rapid and stable matching is achieved. In addition, by providing the ability to automatically set up the initial matching conditions required during and after plasma initiation, operator involvement is reduced, and the initial matching is achieved more rapidly and more reliably. Moreover, various additional aspects described herein provide for more reliable/accurate instrumentation, and more robust control elements in the matching networks.

Recently, experimental results taken from a plasma etch chamber have indicated that harmonic content in electrical signals taken from plasma coupling elements is a viable diagnostic (or control variable) for impedance matching networks. The investigated plasma etch chamber includes two independent RF inputs with respective impedance matching networks. The first RF input inductively couples RF energy to a plasma via a helical coil, and the second RF input provides an RF bias (and DC self-bias) to a substrate via a substrate holding chuck.

Figure 13A:
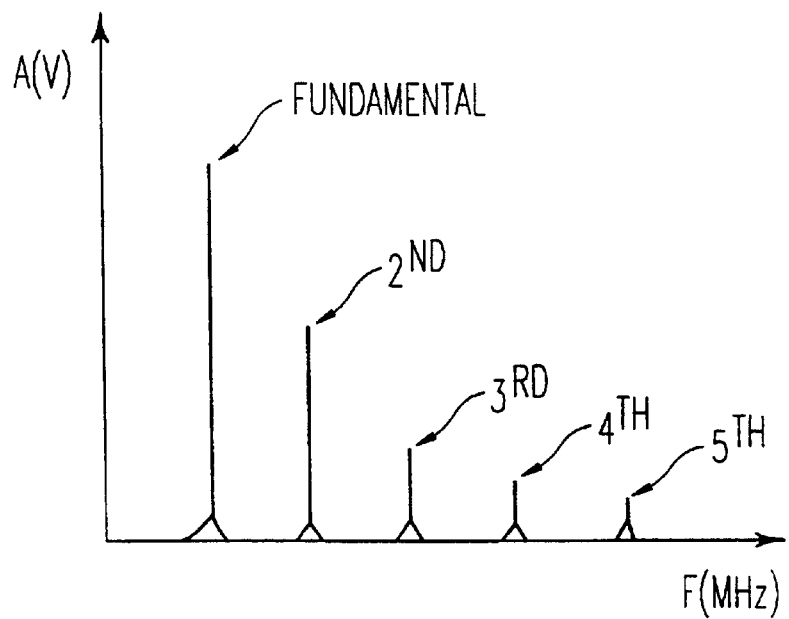
FIG. 13A is a graph showing the first five harmonics in the frequency spectrum taken from voltage measurements sampled at the primary conductor of a plasma system, after removing noise.
Figure 13B:
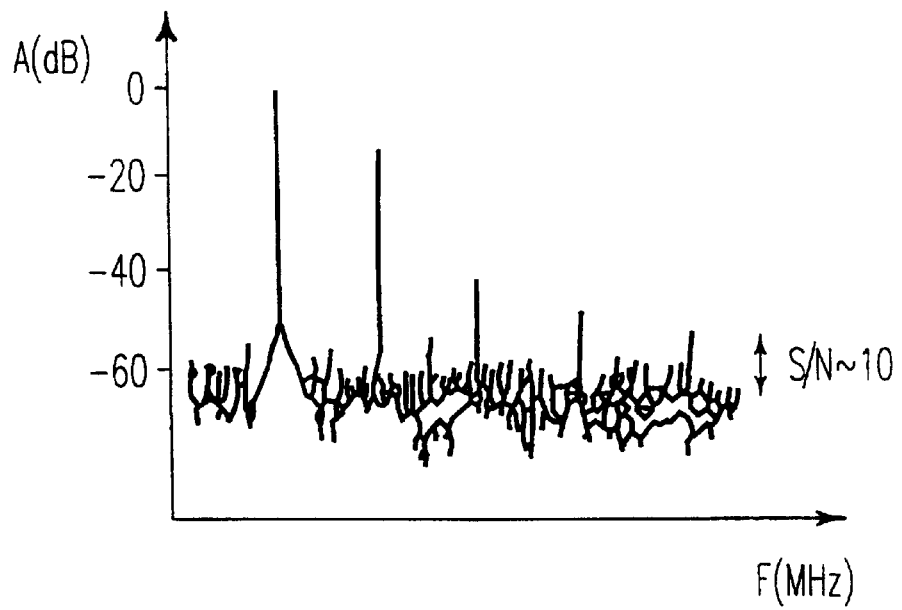
FIG. 13B is a graph showing the spectrum of FIG. 13A, but before removing noise.

Measurements of the voltage were taken on the primary conductor carrying RF power from the impedance matching network to the base of the chuck using a Tektronix high voltage probe. The voltage was sampled at 200 MHz for 15 RF periods of a 13.56 MHz input. The sampling frequency is sufficient to resolve beyond the fifth harmonic. FIGS. 13A and 13B illustrate a typical Fourier transform (frequency spectrum) of a voltage time trace in which the fundamental drive frequency, as well as the second through fifth harmonics are readily identifiable. In FIG. 13A the noise has been removed for clarity. In FIG. 13B, the original signal, including noise, is illustrated. Clearly, the harmonic amplitude decays with increasing harmonic number; however, even the fifth harmonic has a signal-to-noise (S/N) ratio of at least ten. For a given set of conditions existing within the process chamber, a unique set of harmonic ratios can be recorded whereby the harmonic ratios are defined as the harmonic amplitudes at each harmonic frequency normalized by the amplitude of the fundamental (first) drive frequency (i.e., 13.56 MHZ in the example). The measurement of the ratio of harmonic amplitudes on the chuck was determined to be very repeatable (between conditions, chamber maintenance, etc.) and the error in the measurements was determined to be less than 5 to 10% for the second harmonic and less than 2.5% for the odd harmonics.

Figure 14A:
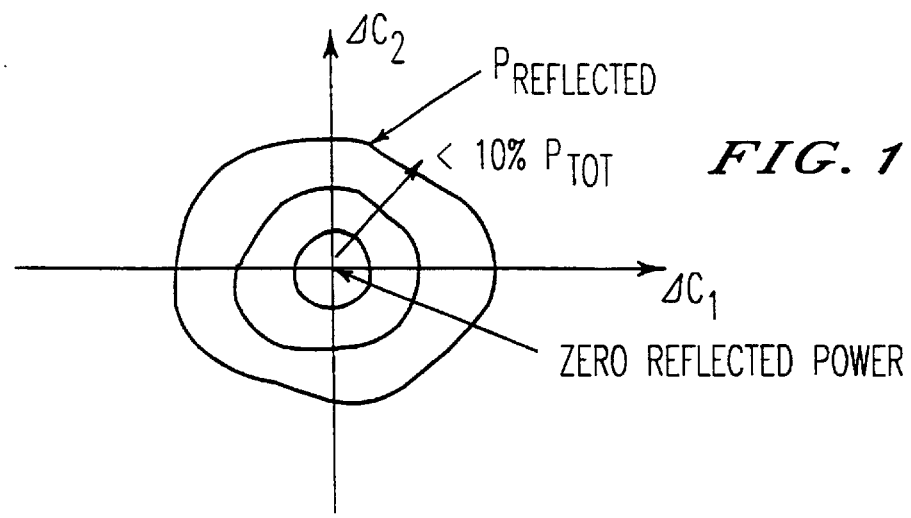
FIGS. 14A–14C are contour plots showing reflected power in a plasma system.

It has been determined that monitoring the harmonic amplitude ratios on the chuck using a high voltage probe can enable the user and/or a feedback controller to tune an impedance matching network for the RF chuck bias to maximize transmitted power and minimize reflected power. FIG. 14A illustrates a contour plot of the reflected power that was measured when de-tuning the matching network (the reflected power never exceeded 10% the forward power).

Figure 14B:
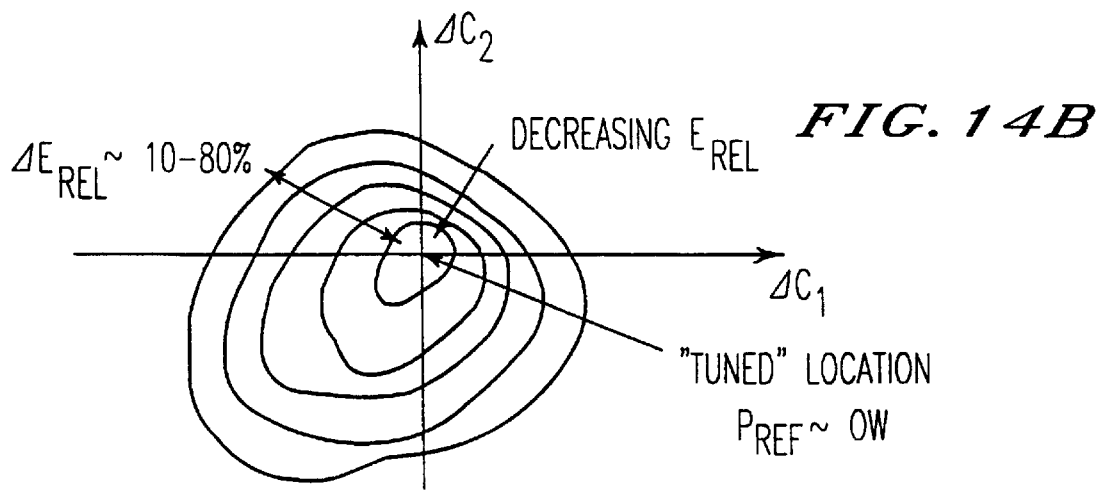

FIG. 14B illustrates a contour plot of the relative error (in the same space as that of FIG. 14A) wherein the x-axis (abscissa) represents changes in the capacitance of the first variable capacitor $C_1$ and the y-axis (ordinate) represents changes in the capacitance of the second variable capacitor $C_2$ (such as would be possible with the structure of FIG. 9). Hence, the origin of the contour plot represents the capacitances of the two capacitor network where the impedance matching network is "tuned" to zero reflected power (to within the error of the watt-meter employed to monitor the reflected power).

The relative error has been defined as the square root of the sum of the square of the normalized errors in each of the harmonic ratios (from the second to the fifth). It may be defined as follows $$E_{rel} = \sqrt{\sum_{n=2}^{5}\left(\frac{\Delta E_n}{E_{n0}}\right)}, \text{ and } \Delta E_n = E_n - E_0,$$

where $E_n$ is the ratio of the amplitude of the nth harmonic to the amplitude of the fundamental drive frequency at a de-tuned impedance match condition (non-zero reflected power) and $E_{n0}$ is the same amplitude ratio at the tuned condition (zero reflected power to within the accuracy of the watt-meter). The tuned settings for the two capacitors $C_1$ and $C_2$ at a given set of process conditions (RF helix power, RF bias power, chamber pressure, gas flow rate, gas specie(s)) was first determined by manual adjustment. As a point of reference, the tuned capacitor settings have been set to the origin in FIG. 14A, as described. The remainder of the data is determined by de-tuning the matching network in the two-dimensional capacitance space surrounding the tuned location. Clearly the tuned setting is a local minimum in the relative error of the harmonic amplitude ratios. The harmonic amplitude ratios are a direct indication of the status of the impedance match condition.

One method of employing such information for tuning an impedance matching network is to predetermine the tuned capacitor settings for a range of input parameter conditions either performed manually by the user or by an automated set of measurements. Given a pre-selected set of input conditions and their respective capacitor settings for a tuned impedance match, the system may search for a tuned location by minimizing the relative error in the measured harmonic ratios taken on the plasma coupling element.

Figure 14C:
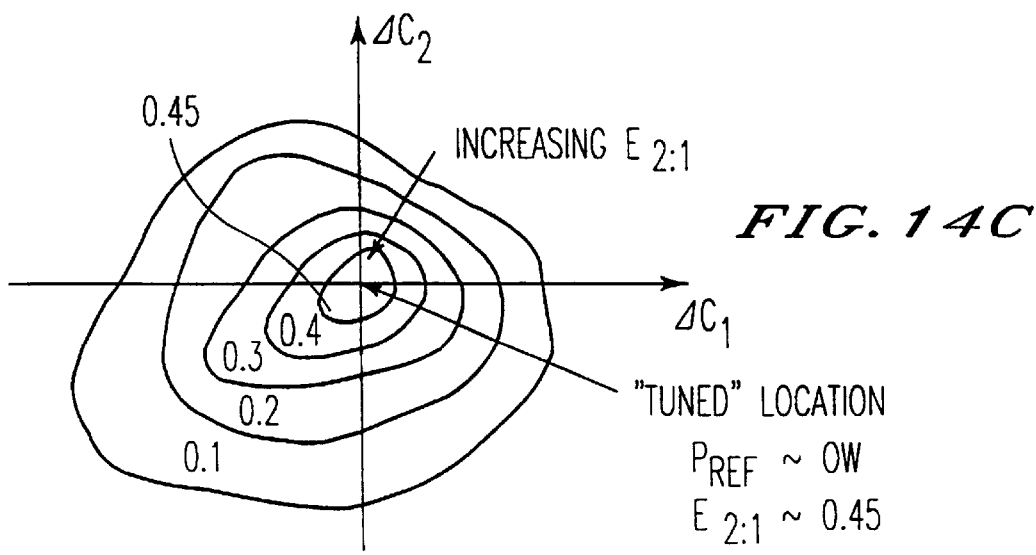

Moreover, the data may be formulated in another way. FIG. 14C illustrates the amplitude ratio of the second harmonic to the fundamental frequency over the same 2-D space defined in FIGS. 14A and 14B. There clearly exists a maximum in the amplitude ratio at the tuned location. Hence, the user and/or an intelligent system incorporating a feedback controller can tune the impedance matching network to zero reflected power by simply adjusting the second harmonic ratio to its maximum value. The present invention is not limited, however, to using the second harmonic as the control variable. Alternate embodiments include using any one of the harmonic ratios, a linear combination of the harmonic ratios, and a non-linear combination of the harmonic ratios. Control depends upon the RF plasma system and, therefore, requires some characterization of the plasma chamber prior to defining the control function. For example, the current system exhibits a robust response to the monitoring of the multiplication of the second and third harmonic ratios.

Thus, a direct correlation between the tuning of the impedance matching network and the ratio of harmonic amplitudes on the substrate holding chuck has been discovered. Furthermore, it has been determined that minimizing and/or maximizing a control function defined as a relationship between the harmonic amplitudes present on the chuck can be used to maximize transferred power and/or minimize reflected power. The use of harmonic amplitudes and their ratios to the amplitude of the fundamental frequency is not limited to the chuck but can be applicable to a variety of electrical plasma coupling elements.

Obviously, numerous modifications and variations of the present invention are possible in light of the above teachings. It is therefore to be understood that, within the scope of the appended claims, the invention may be practiced otherwise than as specifically described herein.

What is claimed is:

1. A system for processing substrates comprising:
    a chamber within which a substrate is processed;
    at least one power source;
    a first electrical component coupled to a region within said chamber, said first electrical component receiving power from said at least one power source;
    a second electrical component coupled to a region within said chamber, said second electrical component receiving power from said at least one power source;
    a first matching network between said at least one power source and said first electrical component, said first matching network matching an impedance of the first electrical component to an impedance of said at least one power source;
    a second matching network between said at least one power source and said second electrical component, said second matching network matching an impedance of the second electrical component to an impedance of said at least one power source; and
    a matching network controller connected to said first matching network and said second matching network, said matching network controller controlling operation of said first matching network and said second matching network.

2. A system as recited in claim 1, further including:
    a third electrical component coupled to a region within said chamber, said third electrical component receiving power from said at least one power source; and
    a third matching network between said third electrical component and said at least one power source, said third matching network matching an impedance of the third electrical component to an impedance of said at least one power source;
    wherein said matching network controller is connected to said third matching network and controls operation of said third matching network.

3. A system as recited in claim 2, wherein said system is a plasma processing system, and wherein said first electrical component is an electrostatic chuck, said second electrical component is a bias shield, and said third electrical component is an inductive coil.

4. A system as recited in claim 1, wherein said matching network controller determines a selected one of said first and second matching networks to perform a matching operation first, such that said selected one performs a matching operation before the other of said first and second matching networks.

5. A system as recited in claim 1, wherein said matching network controller receives signals from at least a first detector and a second detector, and wherein said first detector provides a signal indicating a matching quality of said first electrical component with respect to said at least one power source and said second detector provides a signal indicating a matching quality of said second electrical component with respect to said at least one power source, and further wherein said matching network controller performs a computing operation to determine an amount and direction of tuning required for each of said first and second matching networks in response to said signals from said first and second detectors, and wherein said matching network controller performs a tuning operation of said first matching network after performing said computing operation and said matching network controller performs a tuning operation of said second matching network after performing said computing operation.

6. A system as recited in claim 1, wherein said matching network controller tunes said first matching network and said second matching network to a set of predetermined matching network conditions, and wherein said set of predetermined matching network conditions are stored in a memory.

7. A system as recited in claim 6, wherein said matching network controller stores a plurality of sets of predetermined matching network conditions in a memory.

8. A system as recited in claim 6, wherein said matching network controller modifies said set of predetermined matching network conditions according to a measured matching quality, wherein at least one detector measures said measured matching quality during operation of said system.

9. A system as recited in claim 1, wherein prior to plasma initiation, said matching network controller controls tuning of said first matching network to a set of matching network plasma initiation conditions, and wherein after plasma initiation, said matching network controller controls tuning of said first matching network to a set of matching network plasma sustaining conditions.

10. A system as recited in claim 1, wherein said first matching network includes at least one variable impedance element, and wherein a limit switch is associated with said at least one variable impedance element to prevent excessive movement of a movable member of said variable impedance element, wherein movement of said movable member varies impedance of said variable impedance element.

11. A system as recited in claim 1, wherein said first matching network includes a variable impedance element having a movable member for varying impedance of said variable impedance element, and wherein said system further includes an electric motor for moving said movable member and a switching circuit for controlling said electric motor, said switching circuit comprising a first switch, a second switch, a third switch, and a fourth switch, wherein said motor is driven in a first direction when said first and fourth switches are closed, and further wherein said motor is driven in a second direction opposite to said first direction when said second and third switches are closed.

12. A system as recited in claim 1, wherein said first matching network includes at least one variable impedance element, said first matching network further comprising:
    a limit switch associated with said at least one variable impedance element to prevent excessive movement of a movable member of said variable impedance element, wherein movement of said movable member varies impedance of said variable impedance element; and
    an electric motor to move said movable member, wherein said motor is controlled by a switching circuit, said switching circuit comprising a first switch, a second switch, a third switch, and a fourth switch, wherein said motor is driven in a first direction when said first and fourth switches are closed, and further wherein said motor is driven in a second direction opposite to said first direction when said second and third switches are closed.

13. A system as recited in claim 1, wherein a first cable provides power from said at least one power source to said first matching network, said first cable having a first end proximate to said at least one power source and a second end proximate to said first matching network, the system further including a first forward/reflected power detector connected to said second end of said first cable.

14. A system as recited in claim 13, wherein a second cable provides power from said at least one power source to said second matching network, said second cable having a first end proximate to said at least one power source and a second end proximate to said second matching network, the system further including a second forward/reflected power detector connected to said second end of said second cable.

15. A system as recited in claim 1, further comprising a phase detector circuit for measuring a phase of an input signal from a terminal of said first matching network, said phase detector circuit comprising:
  means for providing an input signal logarithm of a signal including said input signal;
  means for providing a reference signal logarithm of a reference signal;
  means for adding said input signal logarithm and said reference signal logarithm to provide a sum of logarithms;
  means for providing an antilogarithm of said sum of logarithms, said antilogarithm including a product of said input signal and said reference signal; and
  a low-pass filter for filtering said antilogarithm in order to provide a phase output signal, said phase output signal indicating said phase of said input signal.

16. A system as recited in claim 1, further comprising a peak detector circuit for measuring an amplitude of an input signal from a terminal of said first matching network, said peak detector circuit comprising:
  an amplifier having a positive differential input terminal and a negative differential input terminal;
  a diode which provides a rectified output of said amplifier; and
  a low-pass filter which filters said rectified output so as to provide an amplitude output signal, said amplitude output signal indicating said amplitude of said input signal, such that said input signal is received by said positive differential input terminal, and said rectified output is received by said negative differential input terminal.

17. A system as recited in claim 1, further comprising a peak detector circuit for measuring an amplitude of an input signal from a terminal of said first matching network, said peak detector circuit comprising:
  an amplifier having positive and negative differential input terminals and an output terminal;
  a diode;
  a resistor; and
  a capacitor;
  wherein said input signal is received by said positive differential input terminal;
  said diode and said resistor are connected in series between said output terminal of said amplifier and said negative differential input terminal;
  said capacitor is connected between said negative differential input terminal and a ground node;
  said negative differential input terminal is connected to an amplitude output node; and
  said amplitude output node provides an amplitude output signal indicating said amplitude of said input signal.

18. A system for processing substrates comprising:
  a chamber within which a substrate is processed;
  at least one power source;
  a first electrical component coupled to a region within said chamber, said first electrical component receiving power from said at least one power source;
  a first matching network between said first electrical component and said at least one power source, said first matching network matching an impedance of said first electrical component to an impedance of said at least one power source, said first matching network including a variable impedance element, said variable impedance element having a movable member which varies impedance of said variable impedance element upon movement of said movable member; and
  wherein said first matching network further includes a limit switch for limiting movement of said movable member.

19. A system as recited in claim 18, wherein a first cable provides power from said at least one power source to said first matching network, said first cable having a first end proximate to said at least one power source and a second end proximate to said first matching network, the system further including a first forward/reflected power detector connected to said second end of said first cable.

20. A system as recited in claim 19, further comprising an electric motor for moving said movable member and a switching circuit for controlling said electric motor, said switching circuit comprising a first switch, a second switch, a third switch, and a fourth switch, wherein said motor is driven in a first direction when said first and fourth switches are closed, and wherein said motor is driven in a second direction opposite to said first direction when said second and third switches are closed.

21. A system as recited in claim 20, further comprising means for controlling said first matching network.

22. A system as recited in claim 21, further comprising a phase detector circuit for measuring a phase of an input signal from a terminal of said first matching network, said phase detector circuit comprising:
  means for providing an input signal logarithm of a signal including said input signal;
  means for providing a reference signal logarithm of a reference signal;
  means for adding said input signal logarithm and said reference signal logarithm to provide a sum of logarithms;
  means for providing an antilogarithm of said sum of logarithms, said antilogarithm including a product of said input signal and said reference signal; and
  a low-pass filter for filtering said antilogarithm in order to provide a phase output signal, said phase output signal indicating said phase of said input signal.

23. A system as recited in claim 22, further comprising a peak detector circuit for measuring an amplitude of an input signal from a terminal of said first matching network, said peak detector circuit comprising:
  an amplifier having a positive differential input terminal and a negative differential input terminal;

a diode which provides a rectified output of said amplifier; and a low-pass filter which filters said rectified output so as to provide an amplitude output signal, said amplitude output signal indicating said amplitude of said input signal, such that said input signal is received by said positive differential input terminal, and said rectified output is received by said negative differential input terminal.

24. A system as recited in claim 19, further comprising:

a second electrical component receiving power from said at least one power source;

a second matching network between said at least one power source and said second electrical component, said second matching network matching an impedance of the second electrical component to an impedance of said at least one power source; and means for controlling operation of said first matching network and said second matching network, said means for controlling including a matching network controller connected to said first matching network and said second matching network, and wherein said means for controlling determines a selected one of said first and second matching networks to perform a matching operation first, such that said selected one performs a matching operation before the other of said first and second matching networks, said means for controlling further including memory means storing a set of matching network plasma initiation conditions for controlling tuning of said first and second matching networks before initiation of a plasma, said memory means further storing a set of matching network plasma sustaining conditions for controlling tuning of said first and second matching networks after initiation of a plasma.

25. A system as recited in claim 24, further comprising:

a third electrical component, receiving power from said at least one power source; and a third matching network between said third electrical component and said at least one power source, said third matching network matching an impedance of the third electrical component to an impedance of said at least one power source;

wherein said matching network controller is connected to said third matching network and controls operation of said third matching network, and further wherein said matching network controller receives signals from first, second and third detectors indicating a matching quality of each of said first, second and third matching networks, and further wherein said matching network controller includes means for computing a tuning amount of each of said first, second and third matching networks in response to said signals from said first, second and third detectors.

26. A system for processing substrates comprising:

a chamber within which a substrate is processed;

at least one power source;

a first electrical component coupled to a region within said chamber, said first electrical component receiving power from said at least one power source;

a first matching network between said first electrical component and said at least one power source, said first matching network matching an impedance of said first electrical component to an impedance of said at least one power source, said first matching network including a variable impedance element, said variable impedance element having a movable member which varies impedance of said variable impedance element upon movement of said movable member; and wherein said movable member is moved by an electric motor, wherein said motor is controlled by a switching circuit, said switching circuit comprising a first switch, a second switch, a third switch, and a fourth switch, wherein said motor is driven in a first direction when said first and fourth switches are closed, and wherein said motor is driven in a second direction opposite to said first direction when said second and third switches are closed.

27. A system as recited in claim 26, wherein a limit switch is associated with said at least one variable impedance element to prevent excessive movement of said movable member.

28. A system as recited in claim 26, further comprising:

a second electrical component coupled to a region within said chamber, said second electrical component receiving power from said at least one power source;

a second matching network between said at least one power source and said second electrical component, said second matching network matching an impedance of the second electrical component to an impedance of said at least one power source; and a matching network controller connected to said first matching network and said second matching network, said matching network controller receiving signals from a first detector and a second detector indicating a matching quality of each of said first and second matching networks, and wherein said matching network controller includes means for computing a tuning amount of each of said first and second matching networks in response to said signals from said first and second detectors.

29. A system for processing substrates comprising:

a chamber within which a substrate is processed;

at least one power source;

a first electrical component coupled to a region within said chamber, said first electrical component receiving power from said at least one power source;

a second electrical component receiving power from said at least one power source;

a first matching network between said first electrical component and said at least one power source, said first matching network matching an impedance of said first electrical component to an impedance of said at least one power source, wherein a cable provides power from said at least one power source to said first matching network, said cable having a first end proximate to said at least one power source and a second end proximate to said first matching network;

a second matching network between said at least one power source and said second electrical component, said second matching network matching an impedance of the second electrical component to an impedance of said at least one power source;

a matching network controller connected to said first matching network; and said second matching network, said matching network controller controlling operation of said first matching network and said second matching network: and a forward/reflected power detector connected to said second end of said first cable.

30. A system as recited in claim 29, further comprising a matching network controller connected to said first matching network, said matching network controller receiving a signal from said forward/reflected power detector indicating a matching quality of said first matching network, and wherein said matching network controller includes means for computing a tuning amount of said first matching network in response to said signal.

31. A system as recited in claim 30, wherein said matching network controller further includes memory means storing a set of matching network plasma initiation conditions for controlling -tuning of said first matching network prior to initiation of a plasma, said memory means further storing a set of matching network plasma sustaining conditions for controlling tuning of said first matching network after initiation of a plasma.

32. A system for processing substrates comprising:
a chamber within which a substrate is processed;
at least one power source;
a first electrical component coupled to a region within said chamber, said first electrical component receiving power from said at least one power source;
a first matching network between said first electrical component and said at least one power source, said first matching network matching an impedance of said first electrical component to an impedance of said at least one power source, wherein a cable provides power from said at least one power source to said first matching network, said cable having a first end proximate to said at least one power source and a second end proximate to said first matching network;
a forward/reflected power detector connected to said second end of said first cable; and
a phase detector circuit for measuring a phase of an input signal from a terminal of said first matching network, said phase detector circuit comprising:
means for providing an input signal logarithm of a signal including said input signal;
means for providing a reference signal logarithm of a reference signal;
means for adding said input signal logarithm and said reference signal logarithm to provide a sum of logarithms;
means for providing an antilogarithm of said sum of logarithms, said antilogarithm including a product of said input signal and said reference signal; and
a low-pass filter for filtering said antilogarithm in order to provide a phase output signal, said phase output signal indicating said phase of said input signal.

33. A system for processing substrates comprising:
a chamber within which a substrate is processed;
at least one power source;
a first electrical component coupled to a region within said chamber, said first electrical component receiving power from said at least one power source;
a first matching network between said first electrical component and said at least one power source, said first matching network matching an impedance of said first electrical component to an impedance of said at least one power source, wherein a cable provides power from said at least one power source to said first matching network, said cable having a first end proximate to said at least one power source and a second end proximate to said first matching network;
a forward/reflected power detector connected to said second end of said first cable; and a peak detector circuit for measuring an amplitude of an input signal from a terminal of said first matching network, said peak detector circuit comprising:
an amplifier with a positive differential input terminal and a negative differential input terminal;
a diode to provide a rectified output of said amplifier; and
a low-pass filter to filter said rectified output so as to provide an amplitude output signal, said amplitude output signal representing said amplitude of said input signal, such that said input signal is received by said positive differential input terminal, and said rectified output is received by said negative differential input terminal.

34. A system for processing substrates comprising:
a chamber within which a substrate is processed;
at least one power source;
a first electrical component coupled to a region within said chamber, said first electrical component receiving power from said at least one power source;
a first matching network between said first electrical component and said at least one power source, said first matching network matching an impedance of said first electrical component to an impedance of said at least one power source; and
a phase detector circuit for measuring a phase of an input signal from a terminal of said first matching network, said phase detector circuit comprising:
(i) means for providing an input signal logarithm of a signal including said input signal;
(ii) means for providing a reference signal logarithm of a reference signal;
(iii) means for adding said input signal logarithm and said reference signal logarithm to provide a sum of logarithms;
(iv) means for providing an antilogarithm of said sum of logarithms, said antilogarithm including the product of said input signal and said reference signal; and
(v) a low-pass filter for filtering said antilogarithm in order to provide a phase output signal, said phase output signal representing said phase of said input signal.

35. A system as recited in claim 34, further comprising a peak detector circuit for measuring an amplitude of an input signal from a terminal of said first matching network, said peak detector circuit comprising:
an amplifier having a positive differential input terminal and a negative differential input terminal;
a diode which provides a rectified output of said amplifier; and
a low-pass filter which filters said rectified output so as to provide an amplitude output signal, said amplitude output signal indicating said amplitude of said input signal, such that said input signal is received by said positive differential input terminal, and said rectified output is received by said negative differential input terminal.

36. A system as recited in claim 35, wherein said first matching network includes a movable member which varies impedance of a variable impedance element, said first matching network further including a limit switch for preventing excessive movement of said movable member;
wherein said movable member is moved by an electric motor, wherein said motor is controlled by a switching circuit, said switching circuit comprising a first switch, a second switch, a third switch, and a fourth switch, wherein said motor is driven in a first direction when said first and fourth switches are closed, and wherein said motor is driven in a second direction opposite to said first direction when said second and third switches are closed;

the system further including a first cable having a first end proximate to said at least one power source and a second end proximate to said first matching network for supplying power from said at least one power supply to said first matching network, and a first forward/reflected power detector connected to said second end of said first cable.

37. A system as recited in claim 36, further comprising:

a second electrical component coupled to a region within said chamber, said second electrical component receiving power from said at least one power source;

a second matching network between said at least one power source and said second electrical component, said second matching network matching an impedance of the second electrical component to an impedance of said at least one power source; and a matching network controller connected to said first matching network and said second matching network, said matching network controller controlling operation of said first matching network and said second matching network.

38. A system for processing substrates comprising:

a chamber within which a substrate is processed;

at least one power source;

an electrical component coupled to a region within said chamber, said electrical component receiving power from said at least one power source;

a matching network between said electrical component and said at least one power source, said matching network matching an impedance of said electrical component to an impedance of said at least one power source, said matching network including a variable impedance element, said variable impedance element having a movable member which varies impedance of said variable impedance element upon movement of said movable member; and a peak detector circuit for measuring an amplitude of an input signal from a terminal of said first matching network, said peak detector circuit comprising:
(i) an amplifier having a positive differential input terminal and a negative differential input terminal;
(ii) a diode which provides a rectified output of said amplifier; and
(iii) a low-pass filter which filters said rectified output so as to provide an amplitude output signal, said amplitude output signal indicating said amplitude of said input signal, such that said input signal is received by said positive differential input terminal, and said rectified output is received by said negative differential input terminal.

39. A system for processing substrates comprising:

a chamber within which a substrate is processed;

at least one power source;

a first electrical component coupled to a region within said chamber, said first electrical component receiving power from said at least one power source;

a second electrical component coupled to a region within said chamber, said second electrical component receiving power from said at least one power source;

a first matching network between said at least one power source and said first electrical component, said first matching network matching an impedance of the first electrical component to an impedance of said at least one power source;

a second matching network between said at least one power source and said second electrical component, said second matching network matching an impedance of the second electrical component to an impedance of said at least one power source; and first detector means providing a first signal indicating a matching quality of said first matching network;

second detector means providing a second signal indicating a matching quality of said second matching network; and control means for controlling operation of said first matching network and said second matching network, said control means including means for computing a tuning amount of each of said first and second matching networks in response to said first and second signals.

40. A system as recited in claim 39, wherein said first matching network includes a variable impedance element, said variable impedance element having a movable member which varies impedance of said variable impedance element upon movement of said movable member, wherein said movable member is moved by a motor, wherein said motor is controlled by a switching circuit, said switching circuit comprising a first switch, a second switch, a third switch, and a fourth switch, wherein said motor is driven in a first direction when said first and fourth switches are closed, and wherein said motor is driven in a second direction opposite to said first direction when said second and third switches are closed, wherein a limit switch is associated with said at least one variable impedance element to prevent excessive movement of said movable member, and wherein a first cable provides power from said at least one power source to said first matching network, said first cable having a first end proximate to said at least one power source and a second end proximate to said first matching network, wherein said first detector means includes a first forward/reflected power detector connected to said second end of said first cable;

wherein the system further includes a phase detector circuit for measuring a phase of an input signal from a terminal of said first matching network, said phase detector circuit comprising:
(i) means for providing an input signal logarithm of a signal including said input signal;
(ii) means for providing a reference signal logarithm of a reference signal;
(iii) means for adding said input signal logarithm and said reference signal logarithm to provide a sum of logarithms;
(iv) means for providing an antilogarithm of said sum of logarithms, said antilogarithm including the product of said input signal and said reference signal; and
(v) a low-pass filter for filtering said antilogarithm in order to provide a phase output signal, said phase output signal representing said phase of said input signal;

a peak detector circuit for measuring an amplitude of an input signal from a terminal of said first matching network, said peak detector circuit comprising:
(i) an amplifier with a positive differential input terminal and a negative differential input terminal;
(ii) a diode which provides a rectified output of said amplifier; and
(iii) a low-pass filter which filters said rectified output so as to provide an amplitude output signal, said amplitude output signal indicating said amplitude of said input signal, such that said input signal is received by said positive differential input terminal, and said rectified output is received by said negative differential input terminal.

41. A matching network system comprising:

at least one power source;

a first electrical component receiving power from said at least one power source;

a second electrical component receiving power from said at least one power source;

a first matching network between said at least one power source and said first electrical component, said first matching network matching an impedance of the first electrical component to an impedance of said at least one power source;

a second matching network between said at least one power source and said second electrical component, said second matching network matching an impedance of the second electrical component to an impedance of said at least one power source; and a matching network controller connected to said first matching network and said second matching network, said matching network controller controlling operation of said first matching network and said second matching network.

42. A matching network system as recited in claim 41, wherein said matching network controller tunes said first matching network to a first set of predetermined matching network conditions and tunes said second matching network to a second set of predetermined matching network conditions.

43. A matching network system as recited in claim 41, wherein said first and second electrical components are plasma coupling elements, and wherein said matching network controller includes memory means storing a set of matching network plasma initiation conditions for controlling said first and second matching networks before initiation of a plasma, said memory means further storing a set of matching network plasma sustaining conditions for controlling said first and second matching networks after initiation of a plasma.

44. A matching network system as recited in claim 41, further including:

first detector means providing a first signal indicating a matching quality of said first matching network; and second detector means providing a second signal indicating a matching quality of said second matching network;

wherein said matching network controller includes means for computing a tuning amount of each of said first and second matching networks in response to said first and second signals.

45. A system for processing substrates comprising:

a chamber within which a substrate is processed;

at least one power source;

a first electrical component coupled to a region within said chamber, said first electrical component receiving power from said at least one power source;

a second electrical component coupled to a region within said chamber, said second electrical component receiving power from said at least one power source;

a first matching network between said at least one power source and said first electrical component, said first matching network matching an impedance of the first electrical component to an impedance of said at least one power source;

a second matching network between said at least one power source and said second electrical component, said second matching network matching an impedance of the second electrical component to an impedance of said at least one power source; and control means for controlling operation of said first matching network, wherein said control means tunes said first matching network to a first set of predetermined matching network conditions, and wherein said control means receives a first signal indicating a first reflected power at input terminals of said first matching network, and further wherein said control means tunes said first matching network in response to said first signal to minimize said first reflected power, wherein said control means receives a second signal indicating a second reflected power at input terminals of said second matching network, and wherein said control means controls said second matching network in response to said second signal.

46. A method for processing substrates, comprising:

providing a chamber within which a substrate is processed;

providing at least one power source;

providing a first electrical component coupled to a region within said chamber, and supplying said first electrical component with power from said at least one power source;

providing a second electrical component coupled to a region within said chamber, and supplying said second electrical component with power from said at least one power source;

providing a first matching network between said at least one power source and said first electrical component, said first matching network matching an impedance of the first electrical component to an impedance of said at least one power source;

providing a second matching network between said at least one power source and said second electrical component, said second matching network matching an impedance of the second electrical component to an impedance of said at least one power source;

providing a matching network controller connected to said first matching network and said second matching network, and controlling operation of said first matching network and said second matching network with said matching network controller.

47. A method as recited in claim 46, wherein the step of controlling operation of said first matching network and said second matching network includes:

performing a matching operation of a selected one of said first and second matching networks before performing a matching operation of another of said first and second matching networks; and performing a matching operation of said another of said first and second matching networks after performing the matching operation of said selected one of said first and second matching networks.

48. A method as recited in claim 46, wherein the step of controlling operation of said first matching network and said second matching network includes:

measuring a matching quality of said first matching network and a second matching quality of said second matching network before performing a matching operation of said first matching network and before performing a matching operation of said second matching network;

performing a matching operation of said first matching network after measuring said first matching quality and after measuring said second matching quality; and performing a matching operation of said second matching network after measuring said first matching quality and after measuring said second matching quality.

49. A method as recited in claim 46, said method further comprising storing a set of predetermined matching network condition in a memory of said matching network controller, and tuning said first matching network and said second matching network to said set of predetermined matching network conditions.

50. A method as recited in claim 46, wherein a first matching operation is performed according to first matching quality, said first matching quality being determined by measuring a phase of an input signal from said first matching network, said method further comprising:

determining a logarithm of a signal including said input signal;

determining a logarithm of a phase reference signal;

adding said logarithm of said phase reference signal to said logarithm of said signal including said input signal to provide a sum of logarithms;

determining an antilogarithm of said sum of logarithms; and filtering said antilogarithm to provide a phase output signal, said phase output signal representing said phase of said input signal.

51. A method as recited in claim 46, wherein a first matching operation is performed according to first matching quality, said first matching quality being determined by measuring an amplitude of an input signal from said first matching network, said method further comprising:

subtracting an amplitude output signal from said input signal to provide a differential signal;

rectifying said differential signal to provide a rectified signal; and filtering said rectified signal with a low-pass filter to provide said amplitude output signal, said amplitude output signal representing said amplitude of said input signal.

52. A method as recited in claim 46, further including storing a set of matching network plasma initiation conditions in a memory of said matching network controller for controlling said first and second matching networks prior to initiation of a plasma; and storing a set of matching network plasma sustaining conditions in said memory for controlling said first and second matching networks after initiation of a plasma.

53. A method of processing substrates, comprising:

providing a chamber within which a substrate is processed;

providing at least one power source;

providing a first electrical component coupled to a region within said chamber, and supplying said first electrical component with power from said at least one power source;

providing a second electrical component coupled to a region within said chamber, supplying said second electrical component with power from said at least one power source;

providing a first matching network between said at least one power source and said first electrical component, said first matching network matching an impedance of the first electrical component to an impedance of said at least one power source;

providing a second matching network between said at least one power source and said second electrical component, said second matching network matching an impedance of the second electrical component to an impedance of said at least one power source, the method further including controlling operation of said second matching network with said matching network controller; and providing a matching network controller connected to said first matching network, and controlling operation of said first matching network with said matching network controller;

storing a first set of predetermined matching network conditions in a memory of said matching network controller, and tuning said first matching network to said first set of predetermined matching network conditions; and storing a second set of predetermined matching network conditions in said memory of said matching network controller, and tuning said second matching network to said second set of predetermined matching network conditions.

* * * * *